United States Patent [19]

Kadowaki

[11] Patent Number: 5,517,108
[45] Date of Patent: May 14, 1996

[54] FLIP-FLOP CIRCUIT IN A SCANNING TEST APPARATUS

[75] Inventor: Yukio Kadowaki, Minoo, Japan

[73] Assignee: Ricoh Co., Ltd., Tokyo, Japan

[21] Appl. No.: 82,096

[22] Filed: Jun. 24, 1993

Related U.S. Application Data

[62] Division of Ser. No. 691,065, Apr. 24, 1991, Pat. No. 5,252,917.

[30] Foreign Application Priority Data

May 15, 1990 [JP] Japan ................ 2-124658
Sep. 4, 1990 [JP] Japan ................ 2-234956

[51] Int. Cl.⁶ .................................... G06F 11/00
[52] U.S. Cl. .................. 324/158.1; 324/73.1; 371/22.3
[58] Field of Search ................. 324/73.1, 158 R; 371/22.3, 22.4, 22.6, 15.1, 25.1, 27; 307/480; 327/202, 223

[56] References Cited

U.S. PATENT DOCUMENTS

| | | | |
|---|---|---|---|
| 3,761,695 | 7/1973 | Eichelberger | 371/22.3 |
| 3,783,254 | 1/1974 | Eichelberger | 324/617 |
| 3,784,907 | 1/1974 | Eichelberger | 307/480 |
| 4,669,061 | 5/1987 | Bhavsar | 365/201 |
| 4,733,405 | 3/1988 | Shimizume et al. | 327/212 |
| 4,797,004 | 1/1989 | Mori | 371/22.3 |
| 4,912,709 | 3/1990 | Teske et al. | 371/22.3 |
| 4,916,388 | 4/1990 | Sano | 371/22.3 |
| 4,942,577 | 7/1990 | Ozaki | 371/22.3 |
| 4,995,039 | 2/1991 | Sakashita et al. | 371/22.3 |
| 5,023,875 | 6/1991 | Lee et al. | 371/15.1 |
| 5,130,568 | 7/1992 | Miller et al. | 371/22.3 |
| 5,130,647 | 7/1992 | Sakashita et al. | 371/22.3 |
| 5,172,011 | 12/1992 | Leuthold et al. | 327/202 |
| 5,281,864 | 1/1994 | Hahn et al. | 327/202 |
| 5,327,019 | 7/1994 | Kluck | 327/202 |

FOREIGN PATENT DOCUMENTS

| | | | |
|---|---|---|---|
| 25287 | 7/1977 | Japan | G01R 31/28 |
| 28613 | 7/1977 | Japan | G01R 31/28 |
| 28614 | 7/1977 | Japan | G01R 31/28 |

*Primary Examiner*—Vinh P. Nguyen
*Attorney, Agent, or Firm*—Cooper & Dunham

[57] ABSTRACT

A scanning circuit apparatus for test includes a first selecting circuit for selecting one of a normal data signal and a scanning data signal by a first control signal and for transmitting the selected data signal, a second selecting circuit for selecting one of a normal clock signal and a scanning clock signal by a second control signal and for transmitting a first clock signal based on the selected clock signal, a data transferring clock signal generating circuit for generating a second clock signal based on a clock signal for transferring data, a latch section connected to the first selecting circuit, the second selecting circuit and the clock signal generating device for receiving the selected data signal, the first clock signal and the second clock signal and for outputting a signal corresponding to the selected data signal and defined by a logical product of the first clock signal and the second clock signal.

9 Claims, 15 Drawing Sheets

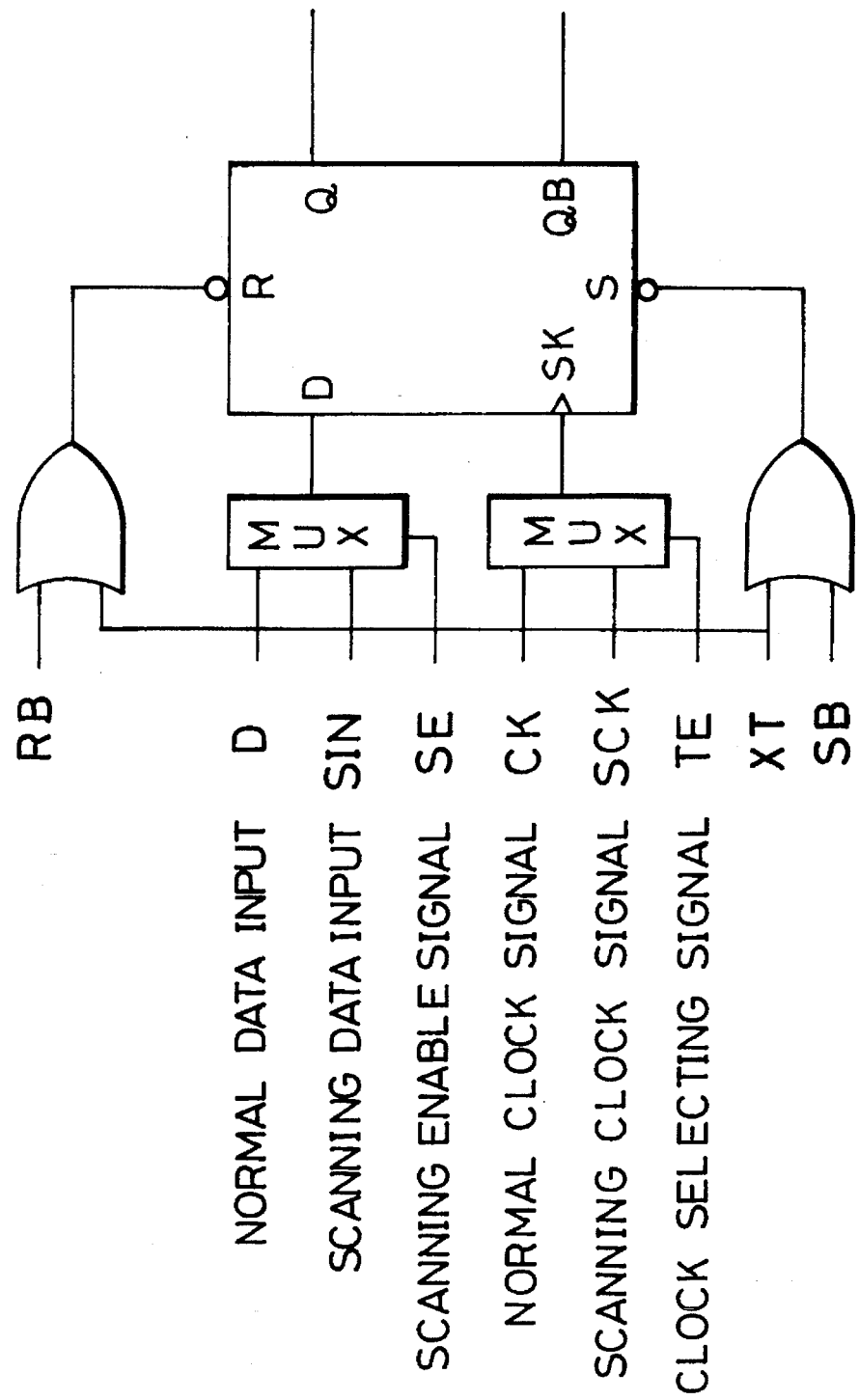

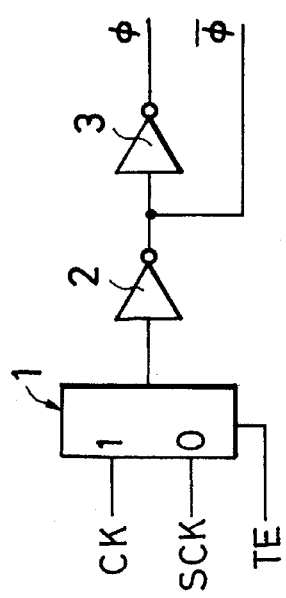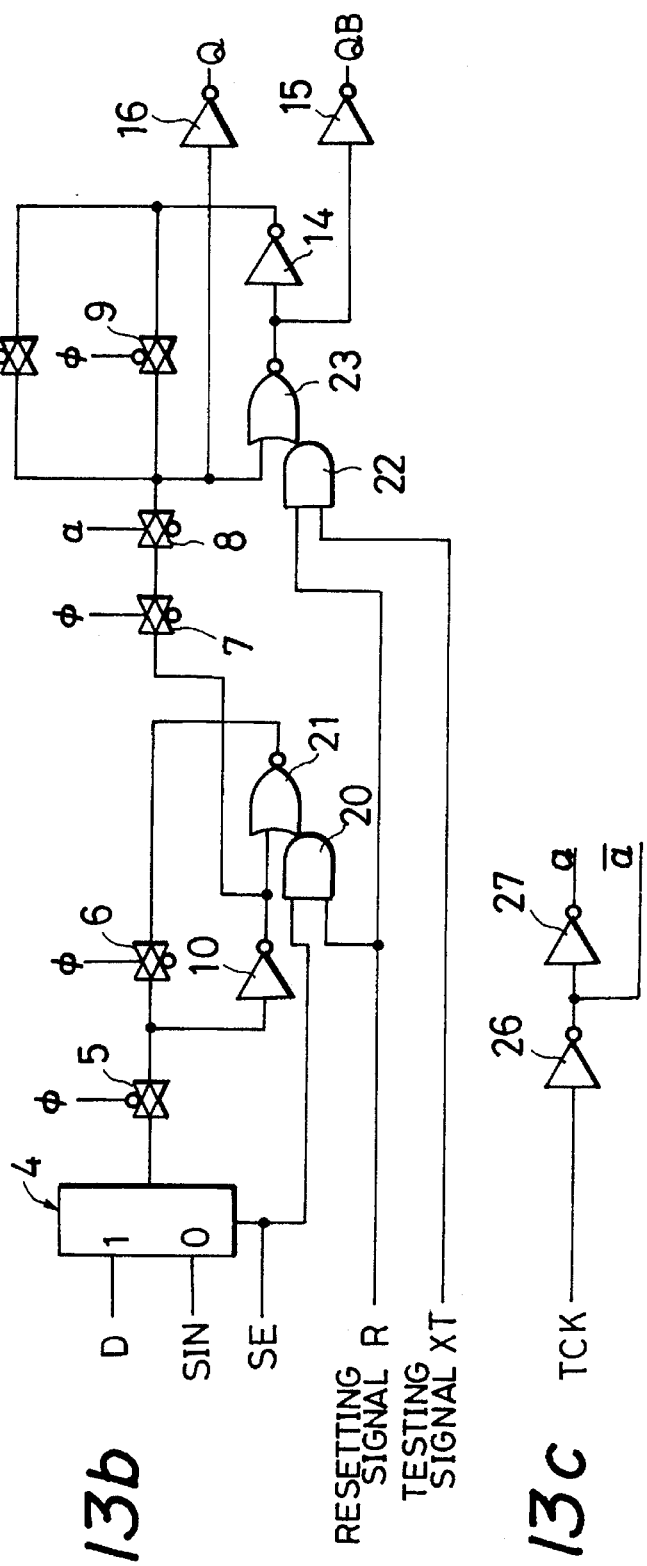
Fig. 13a
Fig. 13b
Fig. 13c

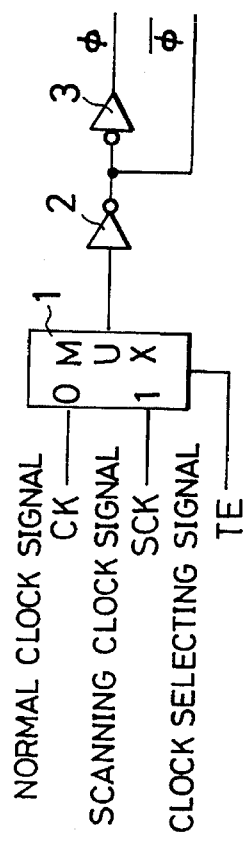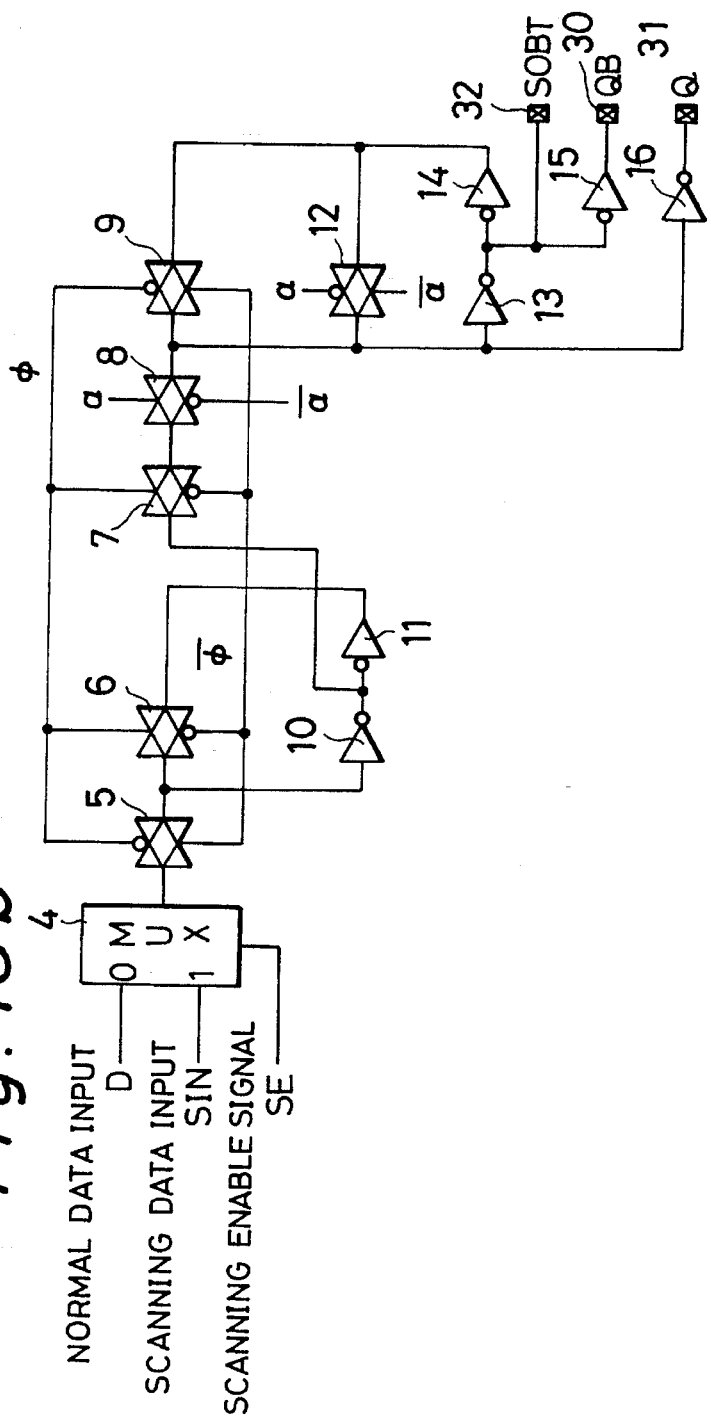
Fig. 15a
Fig. 15b

FLIP-FLOP CIRCUIT IN A SCANNING TEST APPARATUS

This is a division of application Ser. No. 07/691,065, filed Apr. 24, 1991, now U.S. Pat. No. 5,252,917.

BACKGROUND OF THE INVENTION

1. Field of the Invention

The present invention relates to a scanning circuit apparatus for testing a large scale integrated circuit (LSI).

2. Description of the Related Art

In a general scanning circuit apparatus for testing a large scale integrated circuit (LSI), scanning data for test can be supplied to an internal register disposed in the large scale integrated circuit so as to judge whether the large scale integrated circuit is defective or not by finding a defect of the large scale integrated circuit in an operating process thereof. In this general scanning circuit apparatus, a multiplexer disposed in each of a portion for inputting data and a portion for inputting a clock signal in a flip-flop circuit. A normal clock signal and normal input data are selected by the multiplexers at the time of a normal operation of the scanning circuit apparatus. A scanning clock signal and scanning data are selected by the multiplexers at a scanning time of the scanning circuit apparatus. These clock signals and data are selected by a testing control signal. When an input terminal for inputting an asynchronous setting signal, an input terminal for inputting an asynchronous resetting signal, or the input terminals for inputting both the asynchronous setting and resetting signals are disposed in the flip-flop circuit, a gate is disposed before the setting or resetting signal input terminal. In a normal operating state of the scanning circuit apparatus, the setting and resetting signals are validated by the testing control signal. The setting and resetting signals are invalidated by the testing control signal at the scanning and testing times of the scanning circuit apparatus.

With respect to a latch cell, a latch circuit on a master side is used at the normal operating time of the scanning circuit apparatus. A latch circuit for scan on a slave side is also used in addition to the latch cell on the master side. A scanning data output portion of one flip-flop circuit is connected to a scanning data input portion of another scanning circuit. The scanning data output portion and the scanning data input portion are operated as one shift register at the testing time of the scanning circuit apparatus.

In the above general scanning circuit apparatus, the scanning data are generally scanned by only the scanning clock signal. When the data of test results are shifted, it is necessary to reduce a time difference caused by a shift in phase of the scanning clock signal supplied to each scanning circuit for test. This shift in phase is called a clock skew. When the above time difference is large, there is a possibility that the scanning data are destroyed when the scanning data are scanned. For example, a test data output terminal of a scanning register is connected to a scanning data input portion of another scanning register. When the scanning registers are automatically wired in a gate array, etc., there is a case in which the registers are greatly separated from each other. In such a case, a phase shift is caused with respect to a scanning clock signal supplied to each of scanning clock signal input terminals of the scanning registers, thereby causing the above-mentioned clock skew in a certain case.

When the scanning operation is performed at the testing time, the above data of the test results are shifted by latching the scanning data outputted from a previous scanning register in a rise of the scanning clock signal. However, when the above clock skew is caused and the scanning clock signal supplied to the previous scanning register rises faster than a scanning clock signal supplied to a subsequent scanning register, the scanning data outputted from the previous scanning register are changed before the scanning data of the previous scanning register are latched. Therefore, it is impossible to perform a normal shifting operation.

As mentioned above, the setting and resetting operations of a general scanning circuit having setting and resetting terminals are validated at a normal operating time thereof by using a testing control signal. These setting and resetting operations are invalidated at the scanning and testing times of the general scanning circuit by using the testing control signal. Namely, at the scanning and testing times, the transmissions of setting and resetting signals to be inputted to the registers are compulsorily interrupted before these signals are inputted to the registers. Therefore, at the scanning and testing times, it is impossible to test an error in operation of the scanning circuit caused by errors in the setting and resetting signals. In other words, the setting and resetting signals cannot be checked. Accordingly, it is necessary to test the operation of the scanning circuit in a normal operating state thereof with respect to the setting and resetting signals.

SUMMARY OF THE INVENTION

It is therefore a first object of the present invention to provide a scanning circuit apparatus for test in which scanning data outputted from a previous scanning register can be reliably latched to a subsequent scanning register and a setting or resetting signal can be tested by a scanning method.

A second object of the present invention is to provide a scanning circuit apparatus for test in which scanning data outputted from a previous scanning register can be reliably latched to a subsequent scanning register.

The above first object of the present invention can be achieved by a scanning circuit apparatus for test comprising a first selecting means for selecting one of a normal data signal and a scanning data signal by a first control signal and for transmitting the selected data signal; a second selecting means for selecting one of a normal clock signal and a scanning clock signal by a second control signal and for transmitting a first clock signal based on the selected clock signal; a data transferring clock signal generating means for generating a second clock signal based on a clock signal for transferring data; and a latch section connected to the first selecting means, the second selecting means and the data transferring clock signal generating means for receiving the selected data signal, the first clock signal and the second clock signal and for outputting a signal corresponding to the selected data and defined by a logical product of the first clock signal and the second clock signal.

In accordance with the above construction, the second selecting means transmits a first clock signal, the data transferring clock signal generating means generates a second clock signal and the latch section outputs a signal corresponding to the selected data signal selected by the first selecting means and defined by a logic product of the first clock signal and the second clock signal. Accordingly, the data can be inputted such that there is no error in operation of the scanning circuit apparatus even when a great clock skew is caused.

Further, the above latch section can validate the asynchronous setting or resetting operation. The latch circuit can invalidate the setting or resetting operation at a scanning time of the data. The latch section can validate the seting or resetting operation at the time of a testing operation.

The above first object of the present invention can be also achieved by a scanning circuit apparatus for test comprising a first selecting means for selecting one of a normal data and a scaning data signal by a first control signal and for transmiting the selected data signal; a second selecting means for selecting one of a normal clock signal and a scanning clock signal by a second control signal and for transmitting a clock signal based on the selected clock signal; a first latch circuit connected to the first selecting means and the second selecting means and constructed such that validation and invalidation of an asynchronous setting or resetting operation of the first latch circuit are determined at a normal operating time thereof by data selected by the first selecting means based on the clock signal; and a second latch circuit connected to the first latch circuit and the second selecting means, constructed by a D-latch circuit and operated by a clock signal for transferring data.

In accordance with this construction, the second latch circuit can test a latch cell by a scanning method.

The above second object of the present invention can be achieved by a scanning circuit apparatus for test comprising an internal clock signal generating section for generating an internal clock signal; a data transferring clock signal generating section for generating a clock signal for transferring data and capable of shifting data to an electric circuit at the next stage; and a latch section for latching scanning data by the internal clock signal transmitted from the internal clock signal generating section at the time of a testing operation of the scanning circuit apparatus, the latch section transmitting the latched scanning data to a latch circuit having an output section at the next stage by a logic product of the clock signal for transferring data transmitted from the data transferring clock signal generating section and the internal clock signal transmitted from the internal clock signal generating section after a predetermined time has passed since the scanning data were latched.

In accordance with this construction, the latch section latches the scanning data to one latch circuit disposed therein by the internal clock signal transmitted from the internal clock signal generating section. The clock signal for transferring data is transmitted to the latch section from the data transferring clock signal generating section after a time sufficient to be uninfluenced by a clock skew has passed since the scanning data were latched. Thus, the latch section transmits the scanning data latched to the above latch circuit to a latch circuit at the next stage. Accordingly, the internal clock signal generating section, the data transferring clock signal generating section and the latch section are operated to prevent data transmitted from the latch circuit at the previous stage being changed before the data are latched to the latch circuit at the next stage even when the clock skew is caused.

Further objects and advantages of the present invention will be apparent from the following description of the preferred embodiments of the present invention as illustrated in the accompanying drawings.

BRIEF DESCRIPTION OF THE DRAWINGS

FIG. 5 is a circuit diagram showing a general scanning circuit;

FIGS. 13a, 13b and 13c are circuit diagrams showing one example of a reset scanning register circuit;

FIGS. 15a and 15b are circuit diagrams of a scanning circuit apparatus for test in another embodiment of the present invention and respectively correspond to FIGS. 7a and 7b.

DESCRIPTION OF THE PREFERRED EMBODIMENTS

The preferred embodiments of a scanning circuit apparatus for test in the present invention will next be described in detail with reference to the accompanying drawings.

FIG. 5 shows a general scanning circuit apparatus for testing a large scale integrated circuit (LSI). In this general scanning circuit apparatus, scanning data for test can be supplied to an internal register disposed in the large scale integrated circuit so as to judge whether the large scale integrated circuit is defective or not by finding a defect of the large scale integrated circuit in an operating process thereof. In this general scanning circuit apparatus, a multiplexer is disposed in each of a portion for inputting data and a portion for inputting a clock signal in a flip-flop circuit. A normal clock signal and normal input data are selected by the multiplexers at the time of a normal operation of the scanning circuit apparatus. A scanning clock signal and scanning data are selected by the multiplexers at a scanning time of the scanning circuit apparatus. These clock signals and data are selected by a testing control signal. When an input terminal for inputting an asynchronous setting signal, an input terminal for inputting an asynchronous resetting signal, or the input terminals for inputting both the asynchronous setting and resetting signals are disposed in the flip-flop circuit, a gate is disposed before the setting or resetting signal input terminal. In a normal operating state of the scanning circuit apparatus, the setting and resetting signals are validated by the testing control signal. The setting and resetting signals are invalidated by the testing control signal at the scanning and testing times of the scanning circuit apparatus.

With respect to a latch cell, a latch circuit on a master side is used at the normal operating time of the scanning circuit apparatus. A latch circuit for scan on a slave side is also used in addition to the latch cell on the master side. A scanning data output portion $S_{out}$ of one flip-flop circuit is connected to a scanning data input portion $S_{in}$ of another scanning circuit. The scanning data output portion $S_{out}$ and the scanning data input portion $S_{in}$ are operated as one shift register at the testing time of the scanning circuit apparatus.

Figure 1:
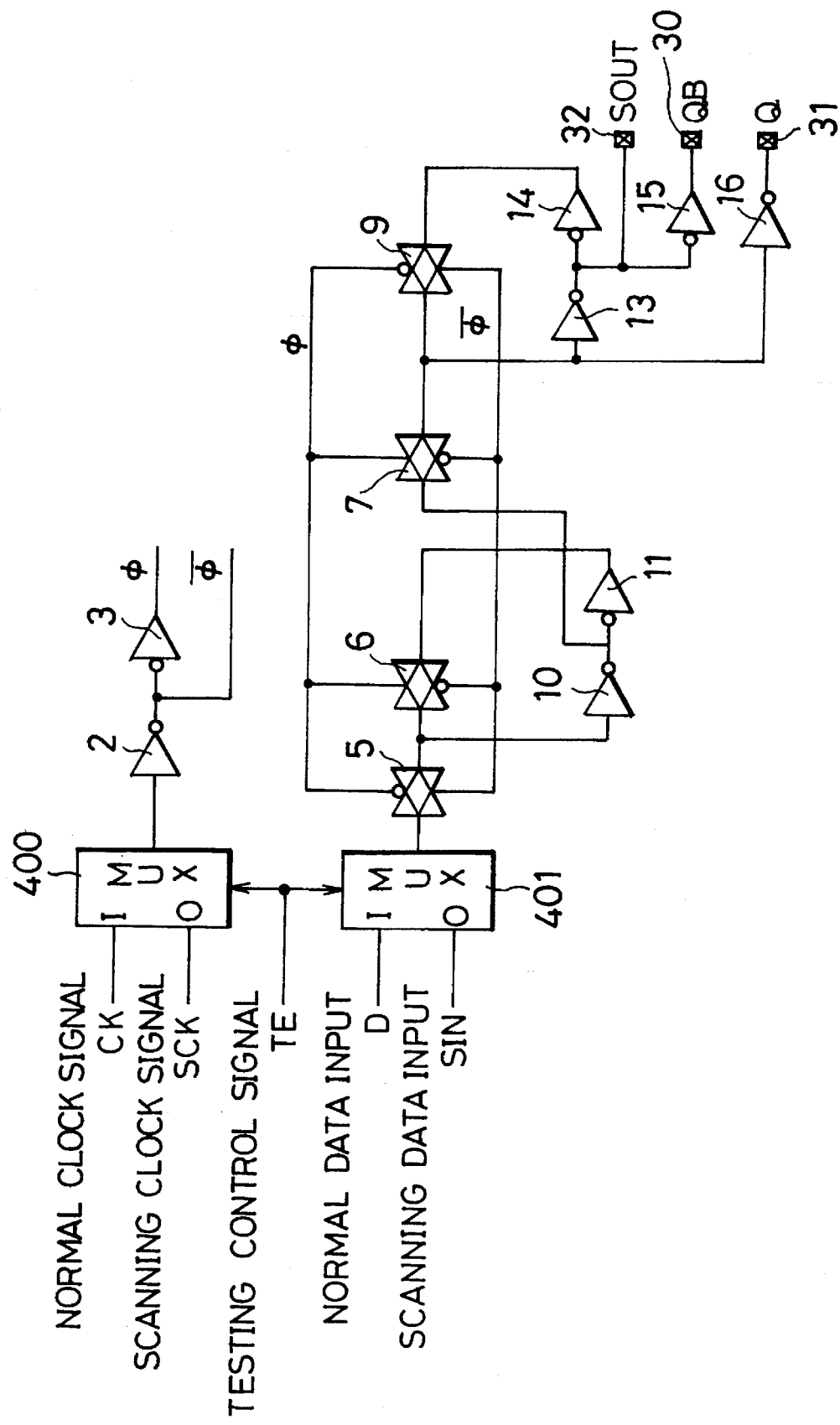
FIG. 1 is a circuit diagram of a general scanning circuit apparatus for test.

In FIG. 1 showing the general scanning circuit apparatus in detail, a normal clock signal is a clock signal at the normal operating time of the scanning circuit apparatus. A scanning clock signal is a clock signal at the testing time of the scanning circuit apparatus. The normal clock signal and the scanning clock signal are inputted to a multiplexer 400. The multiplexer 400 selects one of the normal and scanning clock signals by transmitting a testing control signal for switching normal and testing operations of the scanning circuit apparatus to this multiplexer 400. The multiplexer 400 then outputs the selected clock signal to an inverter 2.

The inverter 2 connected onto an output side of the multiplexer 400 outputs an inverted clock signal having an inverted voltage level of the selected clock signal. This inverted clock signal is shown by mark $\bar{\phi}$ in FIG. 1. An inverter 3 is connected onto an output side of the inverter 2 and outputs the selected clock signal shown by mark $\phi$ in FIG. 1.

A multiplexer 401 receives normal data as input data at the normal operating time of the scanning circuit apparatus and receives scanning data as input data at the testing time of the scanning circuit apparatus. The multiplexer 401 selects one of the normal data and the scanning data by transmitting the testing control signal for switching the normal and testing operations of the scanning circuit apparatus to this multiplexer 401. The multiplexer 401 then outputs the selected data to a transmission gate 5.

The transmission gate 5 connected onto an output side of the multiplexer 401 becomes active at a low voltage level. An output side of the transmission gate 5 is connected to a transmission gate 5 and an inverter 10. The transmission gate 6 becomes active at a high voltage level. An output side of the inverter 10 is connected to a transmission gate 7 at the next stage. The transmission gate 7 becomes active at a high voltage level. An output side of the transmission gate 6 is connected to an input side thereof through the inverters 11 and 10. The above transmission gates 5, 6 and the inverters 10, 11 constitute a latch circuit. The above selected clock signal is transmitted to a disable terminal of the transmission gate 5 and an enable terminal of the transmission gate 6. The inverted clock signal provided by inverting the above selected clock signal is transmitted to an enable terminal of the transmission gate 5 and a disable terminal of the transmission gate 6. When a voltage level of the above clock signal shows value "0", the transmission gate 5 is turned on and the transmission gate 6 is turned off so that output data outputted from the multiplexer 401 are transmitted to the transmission gate 7 through the inverter 10. In contrast to this, when the voltage level of the above clock signal shows value "1", the transmission gate 5 is turned off and the transmission gate 6 is turned on. Accordingly, a circuit portion constructed by the transmission gate 5 and the inverters 10, 11 holds data transmitted from the transmission gate 5 just before the voltage level of the above clock signal is changed to a level showing value "1".

An output side of the transmission gate 7 is connected to a transmission gate 9 which becomes active at a low voltage level. The output side of the transmission gate 7 is also connected through an inverter 16 to a data output terminal 31 for transmitting output data at the normal operating time of the scanning circuit apparatus. The output side of the transmission gate 7 is also connected through inverters 13 and 15 to an inverted data output terminal 30 for transmitting inverted output data at the normal operating time of the scanning circuit apparatus. An output side of the inverter 13 is connected to a test data output terminal 32 for transmitting output data at the testing time of the scanning circuit apparatus.

An output side of the transmission gate 9 is connected to an input side thereof through inverters 14 and 13. The above normal clock signal or the scanning clock signal is transmitted to an enable terminal of the transmission gate 7 and a disable terminal of the transmission gate 9. The transmission gate 7 is turned on when one of the normal and scanning clock signals shows value "1". The transmission gate 7 is turned off when one of the normal and scanning clock signals shows value "0". The transmission gate 9 is turned on when one of the normal and scanning clock signals shows value "0". The transmission gate 9 is turned off when one of the normal and scanning clock signals shows value "1".

Accordingly, when the above clock signal shows value "0", the normal or scanning data outputted from the multiplexer 401 are transmitted through the transmission gate 5. When the voltage level of the above clock signal is then changed to a level showing value "1", data held in the multiplexer 401 are transmitted to the data output terminal 31 through the transmission gate 7 and the inverter 16. The held data are also transmitted to the test data output terminal 32 through the inverter 13. The held data are also transmitted to the inverted data output terminal 30 through the inverters 13, 15. When the voltage level of the above clock signal is then changed to a level showing value "0", the held data are continuously outputted from the respective output terminals 31 and 32.

One scanning register is constructed by the above-mentioned circuit elements. As mentioned above, the test data output terminal 32 of such a scanning register is connected to a scanning data input portion of a scanning register at the next stage, thereby constituting scanning registers at a plurality of stages. The general scanning circuit apparatus for test is constructed by these scanning registers. The operation of such a scanning circuit apparatus at the testing time thereof will next be described.

A voltage level of the testing control signal is set to a level showing value "1" to perform the testing operation. Thus, the reception of a normal clock signal is interrupted by the multiplexer 400 and a scanning clock signal is transmitted through the multiplexer 400. The input of normal data is interrupted by the multiplexer 401 and scanning data are transmitted through the multiplexer 401. Accordingly, the scanning data supplied through the multiplexer 401 are sequentially shifted in synchronization with the scanning clock signal transmitted through the multiplexer 400. As shown by SCANNING DATA INPUT SIN and SCANNING CLOCK SIGNAL SCK in FIG. 2, it is assumed that the scanning data are latched to all the scanning registers in a rise of the scanning clock signal at a time t1. A signal outputted by the scanning circuit apparatus for test from this time constitutes data provided by a scanning operation from the exterior of the scanning circuit apparatus, thereby starting the testing operation.

Figure 2:
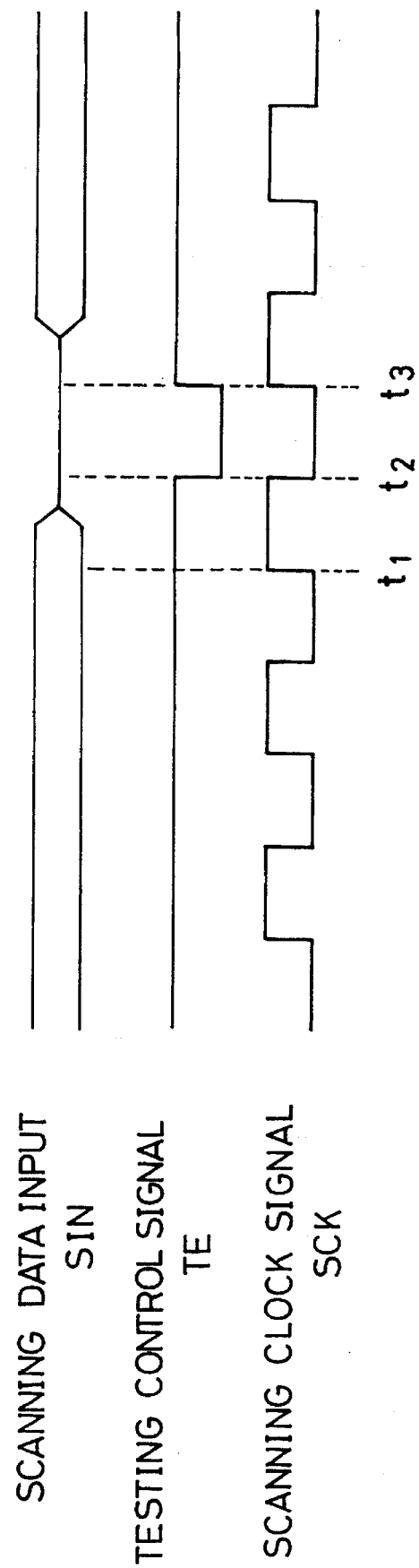
FIG. 2 is a timing chart showing an operation of the scanning circuit apparatus for test shown in FIG. 1.

As shown by TESTING CONTROL SIGNAL TE in FIG. 2, a voltage level of the testing control signal is set to a level showing value "0" from a time t2 to a time t3 so as to latch test results to the scanning circuit apparatus for test so that the normal data are supplied to the scanning registers. As shown by TESTING CONTROL SIGNAL TE and SCANNING CLOCK SIGNAL SCK in FIG. 2, after data of the test results are inputted to a scanning circuit for test, the voltage level of the testing control signal is set to the level showing value "1" at a time t3. Simultaneously, the voltage level of the scanning clock signal is changed to a level showing value "1". Thus, these data of the test results are latched to the scanning registers. Thereafter, the data of the test results are shifted in synchronization with the scanning clock signal supplied to the scanning circuit and are sequentially transmitted to the exterior of the scanning circuit. At this time, next new scanning data are supplied to the scanning circuit from the exterior thereof in synchronization with the scanning clock signal. The testing operation is repeatedly performed in accordance with the above-mentioned operations.

Figure 3:
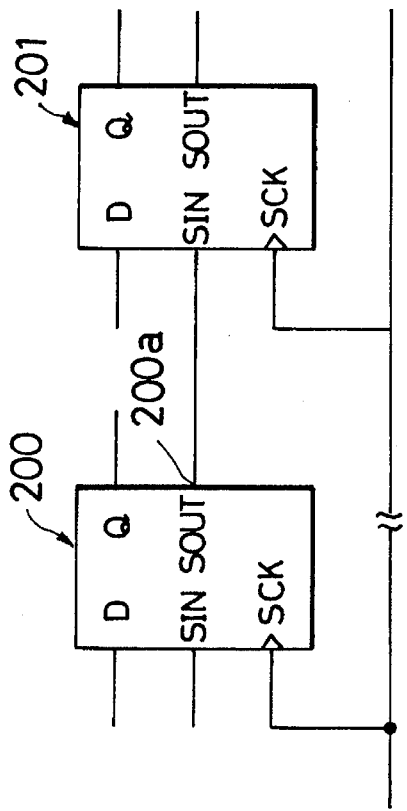
FIG. 3 is a circuit diagram showing a state in which a clock skew is caused.
Figure 4:
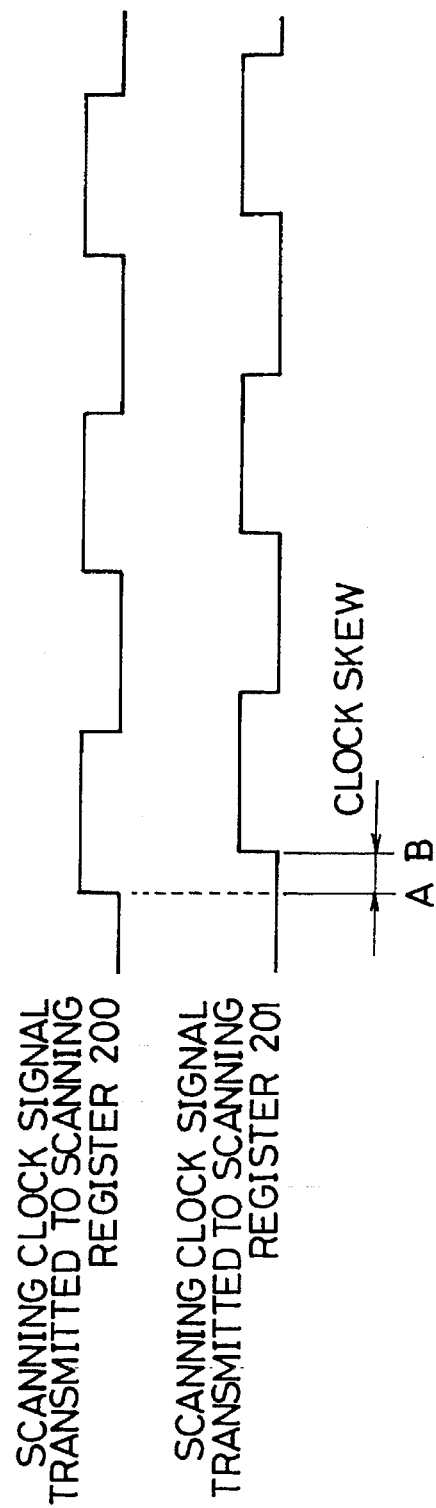
FIG. 4 is a view showing the clock skew.

As mentioned above, the scanning data are generally scanned by only the scanning clock signal. When the above data of the test results are shifted, it is necessary to reduce a time difference caused by a shift in phase of the scanning clock signal supplied to each scanning circuit for test. This shift in phase is called a clock skew. When the above time difference is large, there is a possibility that the scanning data are destroyed when the scanning data are scanned. For example, as shown in FIG. 3, a test data output terminal 200a of a scanning register 200 is connected to a scanning data input portion of another scanning register 201. When the scanning registers 200 and 201 are automatically wired in a gate array, etc., there is a case in which the registers 200 and 201 are greatly separated from each other. In such a case, as shown by points A and B in FIG. 4, a phase shift is caused with respect to a scanning clock signal supplied to each of scanning clock signal input terminals of the scanning registers 200 and 201, thereby causing the above-mentioned clock skew in a certain case.

When the scanning operation is performed at the testing time, the above data of the test results are shifted by latching the scanning data outputted from a previous scanning register in a rise of the scanning clock signal. However, when the above clock skew is caused and the scanning clock signal supplied to the previous scanning register rises faster than a scanning clock signal supplied to a subsequent scanning register, the scanning data outputted from the previous scanning register are changed before the scanning data of the previous scanning register are latched. Therefore, it is impossible to perform a normal shifting operation.

As mentioned above, setting and resetting operations of the general scanning circuit having setting and resetting terminals are validated at the normal operating time thereof by using the testing control signal. These setting and resetting operations are invalidated at the scanning and testing times of the general scanning circuit by using the testing control signal. Namely, at the scanning and testing times, the transmissions of setting and resetting signals to be inputted to the registers are compulsorily interrupted before these signals are inputted to the registers. Therefore, at the scanning and testing times, it is impossible to test an error in operation of the scanning circuit caused by errors in the setting and resetting signals. In other words, the setting and resetting signals cannot be checked. Accordingly, it is necessary to test the operation of the scanning circuit in a normal operating state thereof with respect to the setting and resetting signals.

Figure 7A:
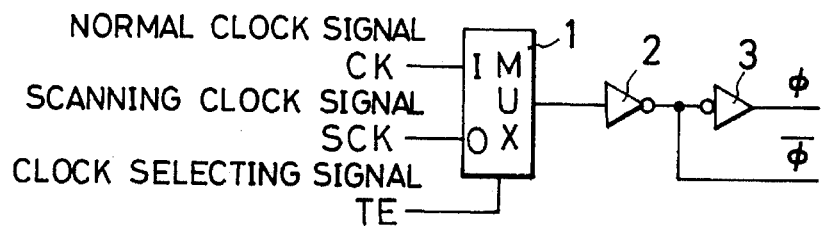
FIGS. 7a, 7b and 7c are circuit diagrams of a scanning circuit apparatus for test in one embodiment of the present invention.
Figure 7B:
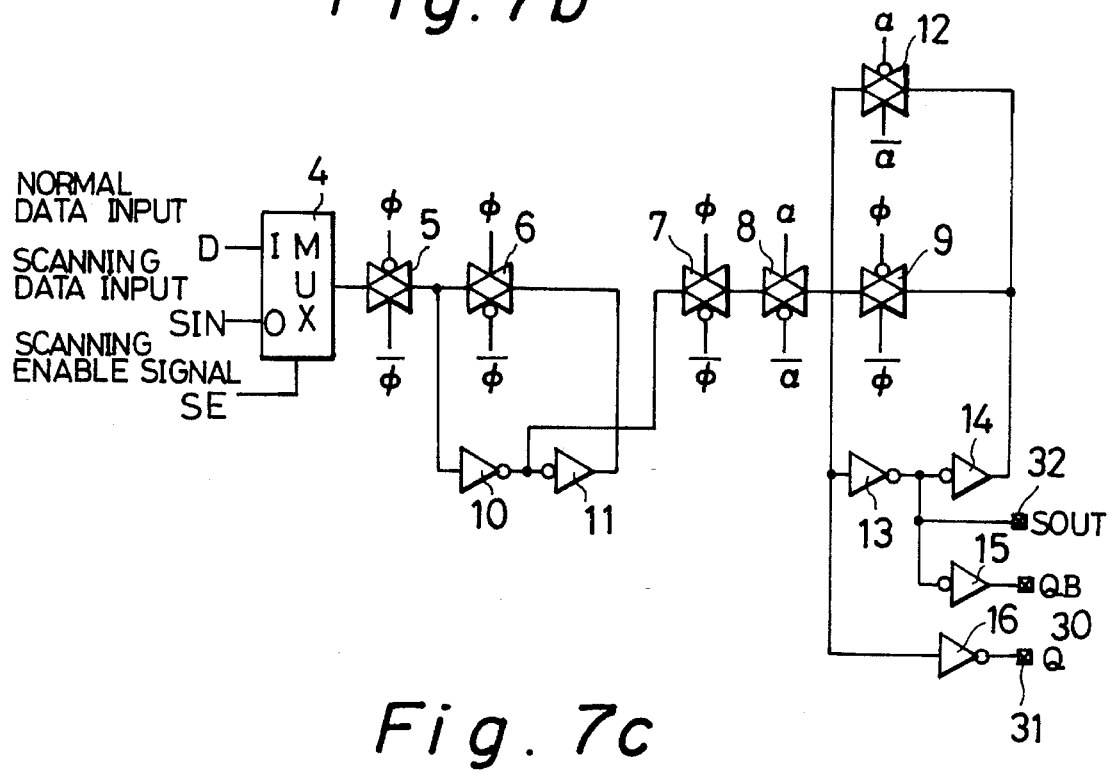
Figure 7C:
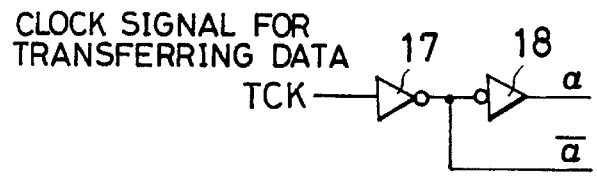

FIGS. 7a, 7b and 7c show a scanning circuit apparatus for test in accordance with one embodiment of the present invention. In FIGS. 7a, 7b and 7c, the same constructional portions as those in FIG. 1 are designated by the same reference numerals and a detailed explanation thereof is therefore omitted in the following description.

A normal clock signal is a clock signal at a normal operating time of the scanning circuit apparatus. A scanning clock signal is a clock signal at a testing time of the scanning circuit apparatus. The normal clock signal and the scanning clock signal are transmitted to a multiplexer 1. The multiplexer 1 selects one of the normal and scanning clock signals by transmitting a clock selecting signal for switching a normal operation and a testing operation of the scanning circuit apparatus to this multiplexer 1. The multiplexer 1 then outputs the selected clock signal to an inverter 2. For example, when a voltage level of the clock selecting signal is a level showing value "0", the multiplexer 1 selects and outputs the normal clock signal. In contrast to this, when the voltage level of the clock selecting signal is a level showing value "1", the multiplexer 1 selects and outputs the scanning clock signal.

As shown by FIG. 7a, an output side of the multiplexer 1 is connected to an inverted clock signal output portion through the inverter 2. An output side of the inverter 2 is connected to a clock signal output portion through an inverter 3. A clock signal (shown by mark $\phi$ in FIG. 7a) and an inverted clock signal (shown by mark $\bar{\phi}$ in FIG. 7a) are generated by the inverters 2 and 3 as internal clock signals.

Normal data are input data at the time of the normal operation of the scanning circuit apparatus. Scanning data are input data at the time of the testing operation of the scanning circuit apparatus. The normal data and the scanning data are supplied to a multiplexer 4. The multiplexer 4 selects one of the normal data and the scanning data by transmitting a scanning enable signal for switching the normal operation and the testing operation of the scanning circuit apparatus to this multiplexer 4. The multiplexer 4 then outputs the selected data to a transmission gate 5. For example, when a voltage level of the scanning enable signal is a level showing value "0", the multiplexer 4 selects and outputs the normal data. In contrast to this, when the voltage level of the scanning enable signal is a level showing value "1", the multiplexer 4 selects and outputs the scanning data.

Similar to the general scanning circuit apparatus for text shown in FIG. 1, an output side of the multiplexer 4 shown in FIG. 7b is connected to transmission gates 5, 6 and a latch circuit on a master side constructed by inverters 10, 11. An output side of the inverter 10 is connected to a transmission gate 7.

An output side of the transmission gate 7 is connected to a transmission gate 8. The transmission gate 8 becomes active at a high voltage level. The transmission gate 8 is turned on when the voltage level of a clock signal for transferring data described in detail later shows value "1". The transmission gate 8 is turned off when the voltage level of this clock signal for transferring data shows value "0". Similar to the general scanning circuit apparatus, an output side of the transmission gate 8 is connected to inverters 13 and 16 and a transmission gate 9. The output side of the transmission gate 8 is also connected to a transmission gate 12. The transmission gate 12 becomes active at a low voltage level. The transmission gate 12 is turned on when the voltage level of the above clock signal for transferring data shows value "0". The transmission gate 12 is turned off when the voltage level of the above clock signal for transferring data shows value "1".

Similar to the general scanning circuit apparatus, an output side of the transmission gate 9 is connected to an inverter 14 and an output side of the transmission gate 12.

At the testing time, the clock signal for transferring data is transmitted to an inverter 17 from a clock generator for test disposed outside a large scale integrated circuit (LSI). As shown in FIG. 7c, the inverter 17 is connected to an inverted clock signal output portion for transferring data. Further, an output side of the inverter 17 is connected to a clock signal output portion for transferring data through an inverter 18. The clock signal for transferring data is shown by mark $\alpha$ in FIGS. 7a, 7b and 7c. The clock signal for transferring data is transmitted to an enable terminal of the above transmission gate 8 and a disable terminal of the transmission gate 12. The inverted clock signal for transferring data is shown by mark $\overline{\alpha}$ in FIGS. 7a, 7b and 7c. The inverted clock signal for transferring data is transmitted to a disable terminal of the above transmission gate 8 and an enable terminal of the transmission gate 12. The transmission gates 7, 8, 9, 12 and the inverters 13 to 16 constitute a latch circuit on a slave side of the scanning circuit apparatus.

One scanning register is constructed by the above-mentioned circuit elements. A scanning data output terminal 32 is connected to the scanning data input portion of a multiplexer 4' of a scanning register at the next stage, thereby constituting scanning registers at a plurality of stages. The scanning circuit apparatus for test is formed by these scanning registers.

Figure 8A:
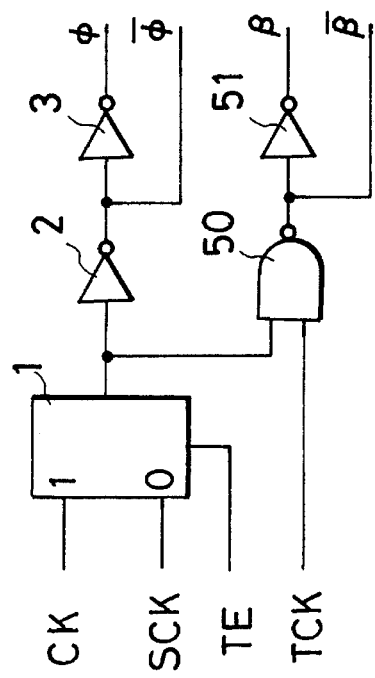
FIGS. 8a and 8b are circuit diagrams of another example of the scanning circuit apparatus shown in FIG. 7a, 7b and 7c.
Figure 8B:
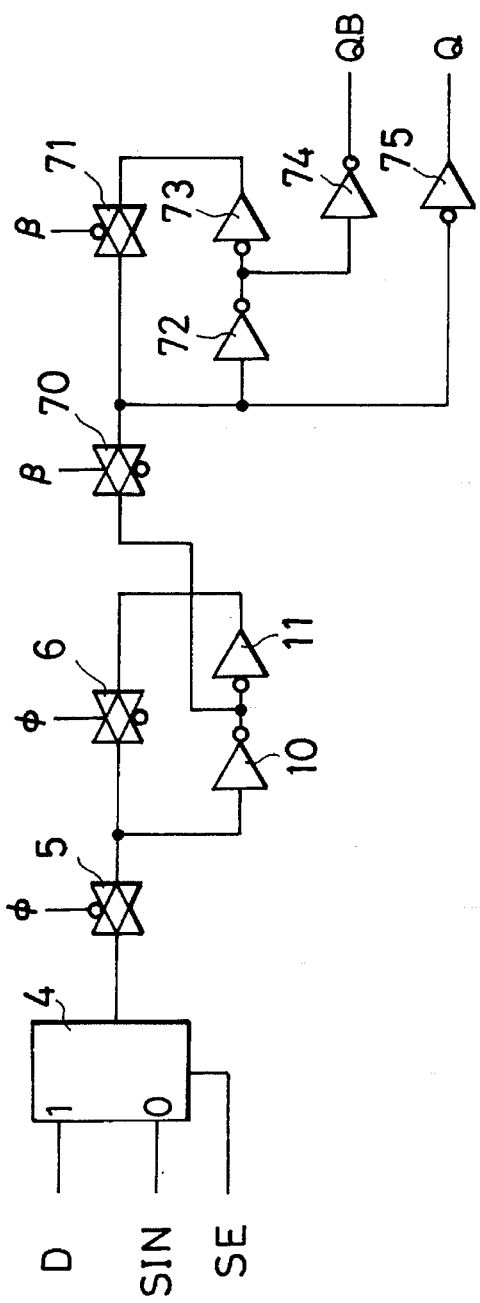

The latch circuit on the slave side is constructed by using a logic product of the clock signals $\phi$ and $\alpha$. A logic operation of the scanning circuit apparatus shown in FIGS. 7a, 7b and 7c is similar to that shown in FIGS. 8a and 8b. In FIG. 8b, a latch circuit on the slave side is constructed by transmission gates 70, 71 and inverters 72 to 75. In FIGS. 8a and 8b, the same constructional portions as those in FIGS. 7a, 7b and 7c are designated by the same reference numerals. As shown by FIG. 8a, a multiplexer 1 multiplexes a normal clock signal (CK) and a scanning clock signal and a clock signal (TCK) for transferring data is transmitted to a NAND circuit 50. A clock signal ($\beta$) on the slave side is generated through an inverter 51 from output signals of the multiplexer 1 and the NAND circuit 50. It is possible to construct the latch circuit on the slave side in various kinds of methods except for the above-mentioned method such that these methods provide the same function for the latch circuit.

The operation of the scanning circuit apparatus for test constructed above will next be described.

Figure 9:
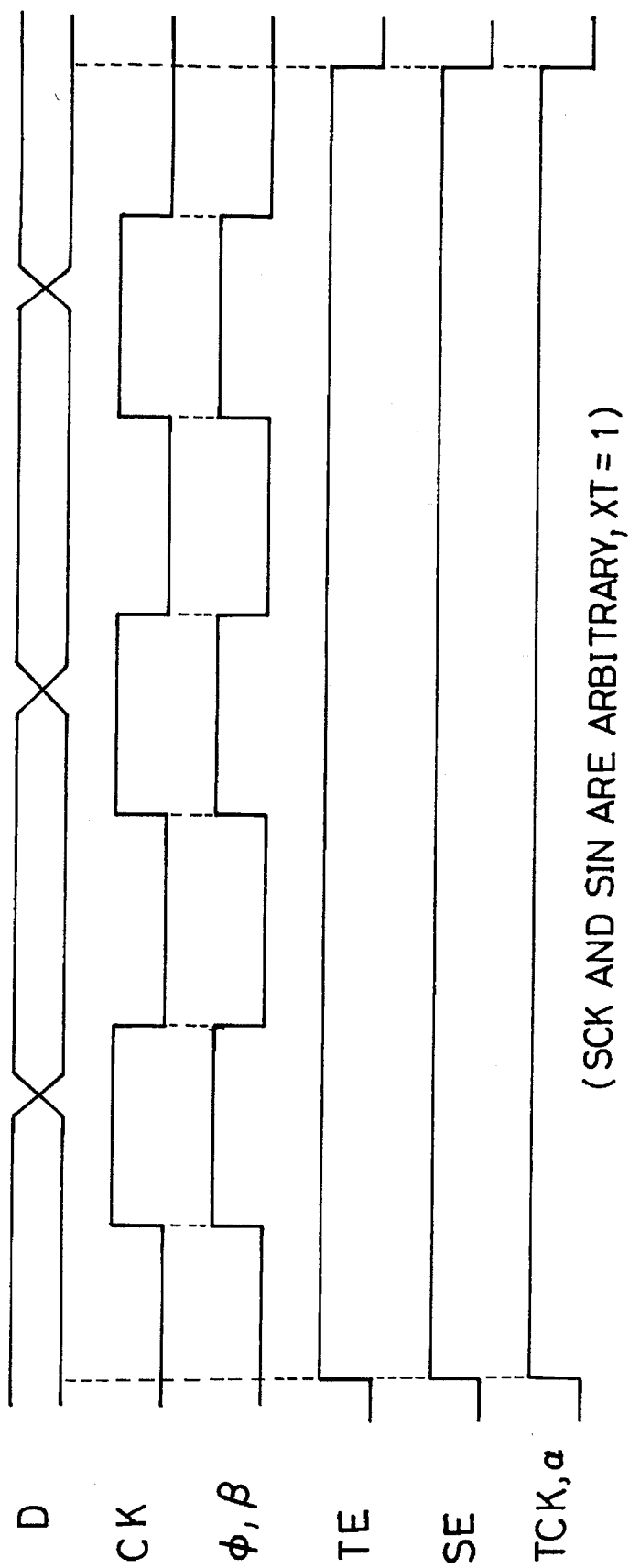
FIG. 9 is a timing chart showing a normal operation of the scanning circuit apparatus shown in FIGS. 7a, 7b and 7c.

FIG. 9 is a timing chart of the scanning circuit apparatus at the time of the normal operation thereof. At the time of the normal operation of the scanning circuit apparatus, all the voltage levels of a testing enable signal (TE), a scanning enable signal (SE) and a clock signal for transferring data (TCK) are set to levels showing value "1". Therefore, a normal clock signal (CK) is selected by the multiplexer 1 to generate an internal master clock signal ($\phi$). In the embodiment shown FIGS. 7a, 7b and 7c, a voltage level of the internal slave clock signal $\alpha$ is fixed to a level showing value "1" so that an operation of the latch circuit on the slave side is dominated by the clock signal $\phi$. In the embodiment shown by FIGS. 8a and 8b, the internal slave clock signal $\beta$ is equal to the clock signal $\phi$. At the time of the normal operation of the scanning circuit apparatus, the voltage level of the scanning enable signal (SE) is changed to a level showing value "1" so that normal data (D) are selected by the multiplexer 4 and are inputted to a latch circuit on the master side. Thus, at the time of the normal operation of the scanning circuit apparatus, the normal data (D) are latched by the normal clock signal (CK).

Figure 10:
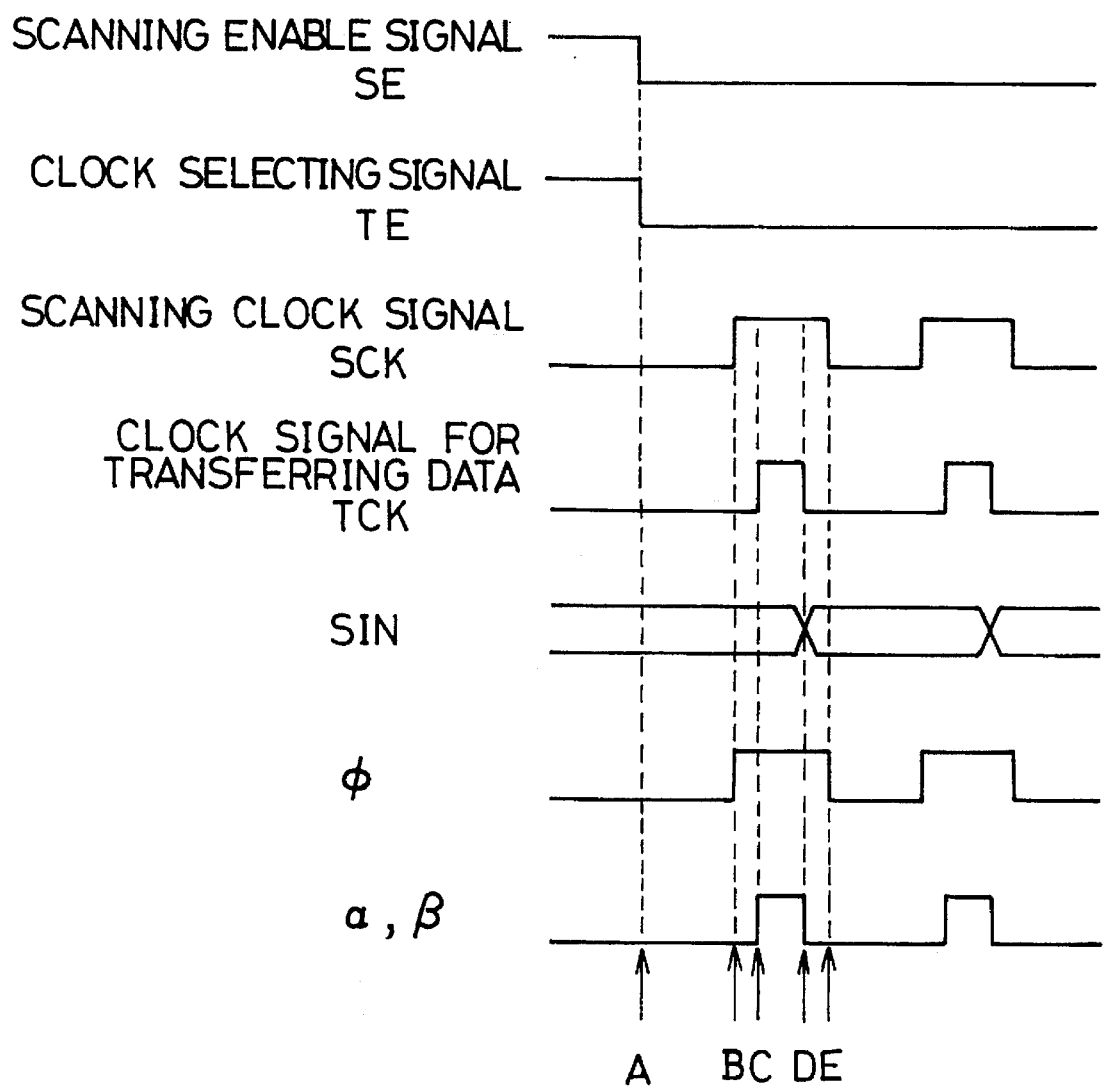
FIG. 10 is a timing chart showing the operation of the scanning circuit apparatus for test shown in FIGS. 7a, 7b and 7c.

As shown by signals SE and TE in FIG. 10, a clock selecting signal having a voltage level indicative of value "0" at a time A is transmitted to the multiplexer 1 to perform the testing operation of the scanning circuit apparatus. A scanning enable signal having a voltage level indicative of value "0" at the same time A is transmitted to the multiplexer 4. Accordingly, the multiplexer 1 selects the scanning clock signal and the multiplexer 4 selects the scanning data. The selected scanning clock signal and the selected scanning data are set to show value "0". In this state, the transmission gate 5 is turned on since the scanning clock signal shows value "0". Accordingly, the scanning data indicative of value "0" transmitted from the multiplexer 4 are supplied to the inverter 10 through the transmission gate 5. The inverter 10 inverts the supplied scanning data indicative of value "0" to scanning data indicative of value "1". These scanning data indicative of value "1" are transmitted from the inverter 10 to the transmission gate 7. At the present time, the voltage level of the scanning clock signal shows value "0" so that the transmission gate 7 is turned off.

The voltage level of the scanning clock signal is changed to a level showing value "1" at a time B as shown by SCANNING CLOCK SIGNAL SCK in FIG. 10. At this time, the transmission gates 5 and 9 are turned off and the transmission gates 6 and 7 are turned on. However, the transmission gate 8 connected to the output side of the transmission gate 7 is still turned off so that the inverter 10 is still electrically disconnected from the inverter 13 on the slave side. Accordingly, test data are held in the latch circuit on the master side at the time B.

The voltage level of the clock signal for transferring data is changed to a level showing value "1" by the above clock generator for test at a time C shown by CLOCK SIGNAL FOR TRANSFERRING DATA TCK in FIG. 10 at which a sufficient time has passed in consideration of the above clock skew of the scanning clock signal. Thus, at the time C, the transmission gate 8 is turned on and the transmission gate 12 is turned off. Accordingly, the scanning data indicative of value "1" transmitted from the inverter 10 are supplied to the inverters 13 and 16. The voltage level of a signal of these scanning data indicative of value "1" is inverted by these inverters 13 and 16. Thus, the scanning data indicative of value "0" are transmitted to the data output terminal 31 and the scanning data output terminal 32 and are then outputted therefrom. The voltage level of an output signal of the inverter 13 is inverted through the inverter 15. Thus, the scanning data indicative of value "1" are outputted from the inverted data output terminal 30. As mentioned above, the test data of the latch circuit on the master side are transmitted to the latch circuit on the slave side at the time C. The voltage level of the scanning clock signal is changed to the level showing value "1" at the above time B. Accordingly, the transmission gate 5 on the master side is turned off at this time B. Therefore, the scanning data outputted from the multiplexer 4 are transmitted onto the slave side, thereby causing no problem that a test vector as the stored scanning data is destroyed.

The voltage level of the clock signal for transferring data is changed to the level showing value "0" at a time D shown by CLOCK SIGNAL FOR TRANSFERRING DATA TCK in FIG. 10. Accordingly, the transmission gate 8 is turned off and the transmission gate 12 is turned on. The scanning data are latched to the latch circuit on the slave side and are held therein. As shown by SCANNING CLOCK SIGNAL SCK in FIG. 10, after the time D, the voltage level of the scanning clock signal is changed to the level showing value "0" at a time E. Accordingly, the transmission gate 5 is turned on and the transmission gates 6 and 7 are turned off. Thus, the next scanning data are supplied to the latch circuit on the master side.

The above-mentioned operations are repeatedly performed so that the scanning data are supplied and set to all the scanning registers while these scanning data are scanned.

Figure 11:
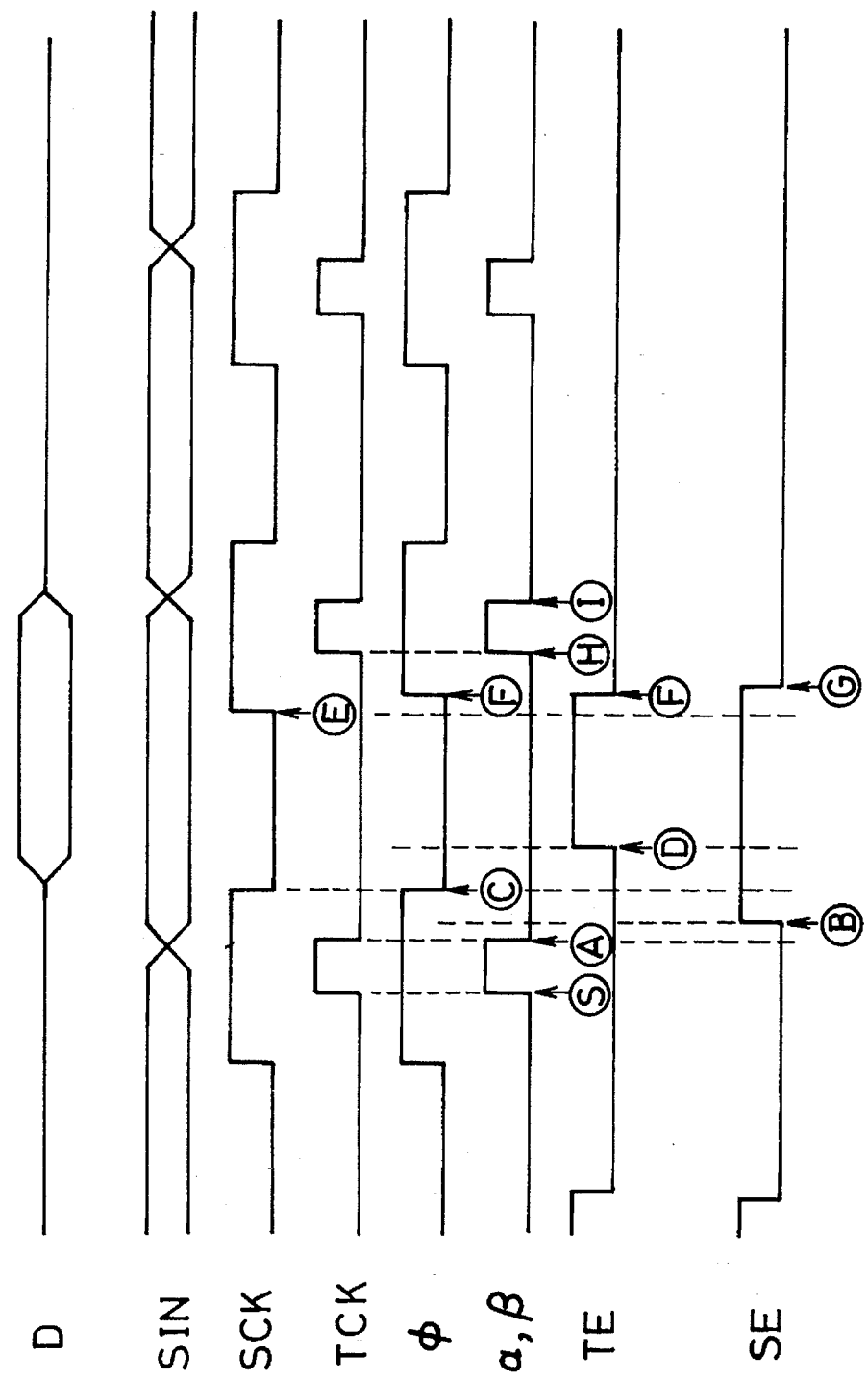
FIG. 11 is a timing chart showing the operation of the scanning circuit apparatus of the present invention when the voltage level of a clock signal with respect to test results shows value "0" in an asynchronous scanning circuit.

It is assumed that test data are inputted onto the slave side of all the scanning registers by a rise of a clock signal on the slave side at a time S shown by signals α and β in FIG. 11. In this case, the test data are transmitted from a latch output portion on the slave side into a tested circuit, thereby starting a testing operation. After the test data are inputted to the latch circuit on the slave side, the test data are latched to this latch circuit by a fall of the clock signal on the slave side. Thereafter, the voltage level of a scanning enable signal (SE) is changed to a level showing value "1" at a time B shown by signal SE in FIG. 11. Thus, the multiplexer 4 selects and supplies normal data (D) onto the latch circuit on the master side. At this time B, the voltage level of a clock signal φ of the latch circuit on the master side shows value "1" and this voltage level is held. Accordingly, the transmission gate 5 is turned off and no test results of the tested circuit supplied as the normal data (D) are supplied to the latch circuit on the master side. The voltage level of the clock signal (φ) on the master side falls at a time C shown by signal SCK in FIG. 11. Thus, the test results from a normal data input portion are supplied to the latch circuit on the master side. The voltage level of a testing enable signal (TE) is changed to a level showing value "1" at a time D shown by signal TE in FIG. 11. Thus, the multiplexer 1 selects the normal clock signal (CK) and the clock signal (φ) on the master side is constructed by the normal clock signal. At this time, when the clock signal at the normal operating time of this scanning register is an asynchronous signal, the voltage level of the normal clock signal (CK) shows value "1" or "0" in accordance with the test results.

When the voltage level of the normal clock signal (CK) shows value "0" with respect to the test results in the case of an asynchronous scanning register, the voltage level of the clock signal (φ) on the master side is a level showing value "0" as it is even when the voltage level of the testing enable signal (TE) is changed to a level showing value "1". The voltage level of a scanning clock signal (SCK) is changed to a level showing value "1" at a time E shown by signal SCK in FIG. 11. When the voltage level of the testing enable signal (TE) is changed to a level showing value "0" at a time F shown by signal TE in FIG. 11, the clock signal (φ) on the master side rises at the time F shown by signal φ in FIG. 11. Accordingly, the inputted test results from the normal data (D) are held in the latch circuit on the master side. Thereafter, the voltage level of a clock signal for transferring data (TCK) is changed to a level showing value "1". Thus, a clock signal (α or β) on the slave side rises at a time H shown by signals α, β in FIG. 11 and the test results are supplied to the latch circuit on the slave side. Thus, the previous test data supplied onto the slave side are destroyed so that the test results supplied onto the master side are changed. However, the voltage level of the clock signal (φ) on the master side is a level showing value "1" and this voltage level is held so that the previous test results held in the latch circuit on the master side are not influenced by this change in the test results.

Figure 12:
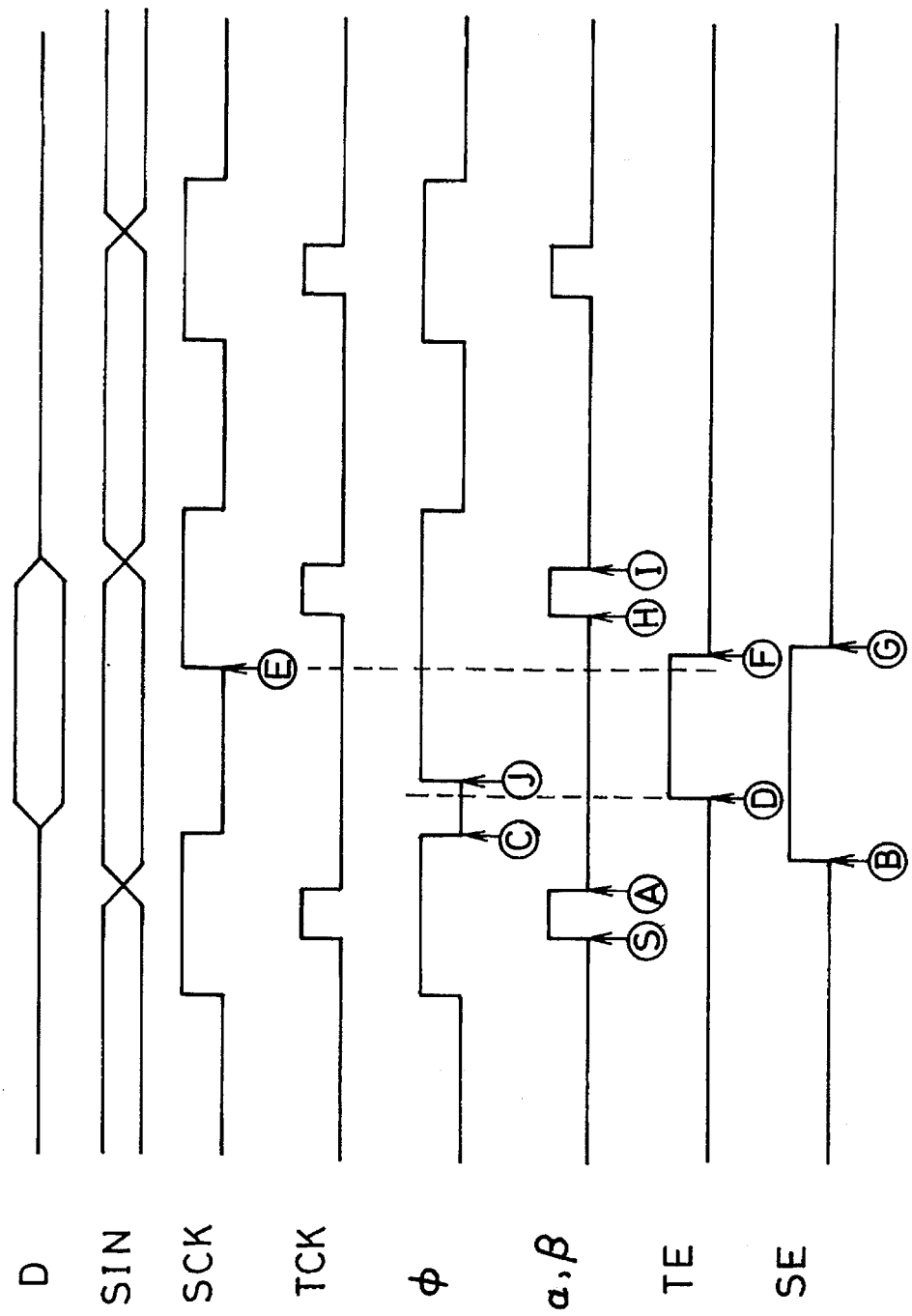
FIG. 12 is a timing chart showing the operation of the scanning circuit apparatus of the present invention when the voltage level of the clock signal with respect to the test results shows value "1" in the asynchronous scanning circuit.

When the voltage level of the normal clock signal (CK) is a level showing value "1" with respect to the test results in the case of the asynchronous scanning register and the voltage level of the testing enable signal (TE) is changed to a level showing value "1" at a time D shown by signal TE in FIG. 12, the voltage level of the clock signal (φ) on the master side is changed to a level showing value "1" at a time J shown by this signal φ in FIG. 12. Then, after the voltage level of the clock signal (φ) shows value "1" and the voltage level of the scanning clock signal (SCK) is changed to a level showing value "1" at a time E shown by this signal SCK in FIG. 12, the voltage level of the testing enable signal (TE) is changed to a level showing value "0". At this time, the voltage level of the clock signal (φ) is still the level showing value "1" as shown by signal φ in FIG. 12. Namely, a timing for holding the test results in the asynchronous scanning register depends on a normal clock input of the asynchronous scanning register at the testing time. Namely, the test results are influenced by the normal clock input of the asynchronous scanning register so that it is possible to check an error in the normal clock input from the exterior of the scanning circuit apparatus, thereby improving a rate of fault detection. Times A to I and S shown in FIG. 12 are equal to those shown in FIG. 11.

An asynchronous setting or resetting scanning register will next be described. In FIGS. 13a, 13b and 13c, the same constructional portions as those in FIGS. 7a, 7b and 7c are designated by the same reference numerals and an explanation thereof is therefore omitted in the following description. A scanning enable signal (SE) is inputted to a multiplexer 4 and this signal (SE) and a resetting signal (R) are inputted to an AND circuit 20. Output signals of the AND circuit 20 and an inverter 10 are inputted to a NOR circuit 21. An output signal of the NOR circuit 21 is transmitted to a transmission gate 6. The above resetting signal (R) and a testing signal (XT) are inputted to an AND circuit 22. Output signals of the AND circuit 22 and a transmission gate 8 are inputted to a NOR circuit 23. An output signal of the NOR circuit 23 is transmitted to inverters 14 and 15.

In such a scanning register, latch circuits on the master and slave sides can be asynchronously reset. A resetting operation of the latch circuit on the master side is validated when a voltage level of the scanning enable signal (SE) is a level showing value "1". The latch circuit on the master side cannot be reset when the voltage level of the scanning enable signal (SE) is a level showing value "0". Namely, the resetting operation of the latch circuit on the master side is invalidated when the voltage level of the scanning enable signal (SE) is the level showing value "0". A resetting operation of the latch circuit on the slave side is validated when a voltage level of the testing signal (XT) is a level showing value "1". The resetting operation of the latch circuit on the slave side is invalidated when the voltage level of the testing signal (XT) is a level showing value "0".

The operation of such a scanning register will next be described. The operation of the scanning register shown in FIGS. 13a, 13b and 13c can be explained with reference to the timing charts shown in FIGS. 9 to 12. The scanning register is of a synchronous type in this case. Accordingly, the operation of the scanning register will be explained by using the timing chart shown in FIG. 11 in which the voltage level of the normal clock signal (CK) at the testing time is fixed to a level showing value "0".

As shown in FIG. 9, at a normal operating time of the scanning register, the voltage levels of signals (TE), (SE), (TCK) and (XT) respectively show value "1". A normal clock signal (CK) and a normal data signal (D) are respectively selected by the multiplexers 1 and 4. A resetting signal (R) of the latch circuit on the master side is validated since the scanning enable signal (SE) shows value "1". A resetting signal (R) on the latch circuit on the slave side is also validated since the testing signal (XT) shows value "1". Therefore, the operation of this scanning register is similar to that of a normal reset register.

At the testing time, a voltage level of the testing signal (XT) is changed to a level showing value "0". Accordingly, the resetting signal (R) of the latch circuit on the slave side is invalidated at any time. This resetting signal (R) is invalidated not to destroy test data transmitted by a scanning operation of the scanning circuit apparatus even when an asynchronous resetting signal is inputted to the scanning register when the testing operation is performed by a scanning system. As shown in FIG. 10, when the test data are scanned and transmitted to each scanning register, the voltage levels of the signals (TE), (SE) and (XT) are changed to levels showing value "0". The resetting signal (R) of the latch circuit on the master side is invalidated since the scanning enable signal (SE) shows value "0". Accordingly, no test data of the latch circuit on the master side are destroyed by changing the resetting signal in the scanning operation of the test data. Similar to the resetting signal (R) on the master side, the resetting signal (R) of the latch circuit on the slave side is also invalidated since the testing signal (XT) shows value "0". Thus, the test data can be scanned irrespective of an asynchronous resetting operation.

The scanning circuit apparatus is operated as follows when the test data are latched to all the scanning registers. The test data are inputted to the latch circuit on the slave side at a time S shown by signals α and β in FIG. 11. Thus, the test data are transmitted into the latch circuit on the slave side, thereby starting a testing operation. An operation of the latch circuit on the slave side is stopped at a time A shown by signals α and β in FIG. 11, thereby holding the test data in this latch circuit. Thereafter, the voltage level of the scanning enable signal (SE) is changed to a level showing value "1". Thus, the multiplexer 4 selects normal data (D) and test results are transmitted to the latch circuit on the master side. Simultaneously, the resetting signal (R) of the latch circuit on the master side is validated since the voltage level of the scanning enable signal (SE) is changed to the level showing value "1". Contents of the latch circuit on the master side are reset if the resetting signal (R) shows value "1" with respect to the test results. However, the latch circuit on the slave side already holds the test data so that no test data in the latch circuit on the slave side are influenced by the change in the contents of the latch circuit on the master side. If the resetting signal shows value "0" with respect to the test results, the test results are transmitted to the latch circuit on the master side through the normal data input portion (D) and the multiplexer 4 when a clock signal on the master side falls at a time C shown by signal φ in FIG. 11.

As mentioned above, the latch circuit on the master side shows value "0" when the resetting signal shows value "1" with respect to the test results. The test results of the normal data input portion (D) are transmitted to the latch circuit on the master side when the resetting signal shows value "0" with respect to the test results. In this state, the clock signal on the master side rises at a time F shown by this signal φ in FIG. 11 and the test results are held in the latch circuit on the master side. In this state, the asynchronous resetting signal (R) is validated. Accordingly, after the clock signal on the master side rises, the voltage level of the scanning enable signal (SE) is changed to a level showing value "0" at a time G shown by this signal SE in FIG. 11 to invalidate the resetting signal. Thereafter, the latch circuit on the slave side is operated at a time H shown by signals α and β in FIG. 11 such that the test results on the master side are transmitted to this latch circuit on the slave side. Then, the test results latched to each of the scanning registers are sequentially shifted out at a timing shown in FIG. 10. These test results are then compared with those of an expected pattern to judge whether a chip is defective or not. Simultaneously, the next test data are scanned.

As mentioned above, validation and invalidation of the setting or resetting operation of the latch circuit on the master side can be switched by the scanning enable signal. Validation and invalidation of the setting or resetting operation of the latch circuit on the slave side can be switched by the testing enable signal. The setting or resetting operation of both the latch circuits on the master and slave sides is invalidated at the scanning time. The setting or resetting operation of the latch circuit on the master side is validated only at the testing time. Thus, it is possible to test the setting or resetting signal by the scanning method.

Figure 6A:
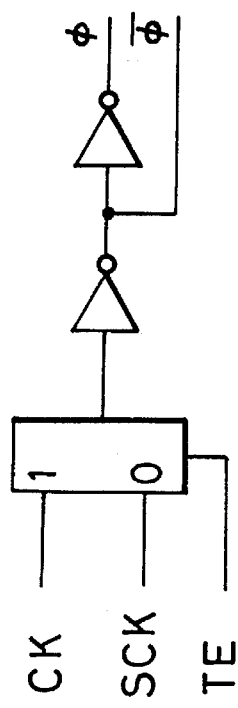
FIGS. 6a and 6b are circuit diagrams showing a general latch circuit for scan.
Figure 6B:
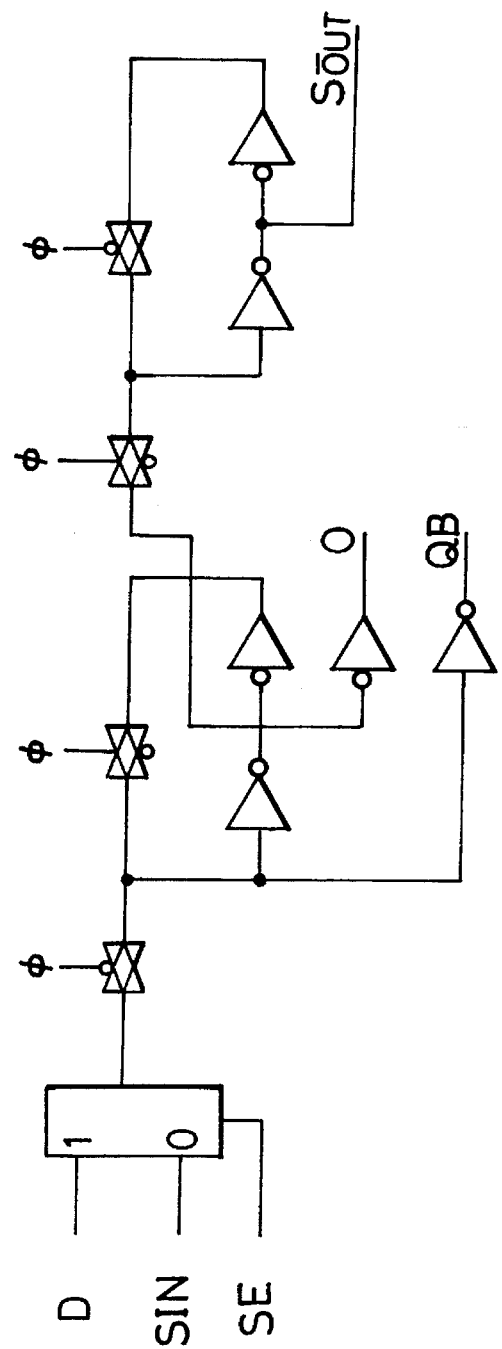

The scanning circuit with respect to the latch circuits will finally be described. When the testing operation is performed by the scanning method, it is necessary to transmit test data into the scanning circuit by shifting these test data. Accordingly, when an internal latch circuit is used for the scanning register, it is necessary to construct the internal latch circuit by a flip-flop circuit of a master slave type. As shown in FIGS. 6a and 6b, the general latch circuit for scan is formed in a shape in which a latch circuit for scan is additionally disposed on the slave side when a latch circuit used at the normal operating time is disposed on the master side. In this case, the latch circuit on the master side holds scanning data at the testing time. Therefore, test data must be held at the testing time at any time. However, when test results are inputted to the scanning latch circuit after the testing operation, the test data held for test are destroyed in the latch circuit on the master side and the test results are then supplied to the latch circuit on the master side. As a result, the test results are transmitted from the latch circuit on the master side although the test data were transmitted from this latch circuit on the master side so far. Namely, the test data are changed by supplying the test results to the latch circuit on the master side so that there is a case in which the test results are changed by this change in the test data through this latch circuit. No problem is caused if the data of the latch circuit on the master side are held until the test results are influenced by the changed test data after the test results are first supplied to the latch circuit on the master side. However, it is difficult to preferably hold the test results by the latch circuit on the master side since there are problems with respect to timing and clock skew.

Figure 14A:
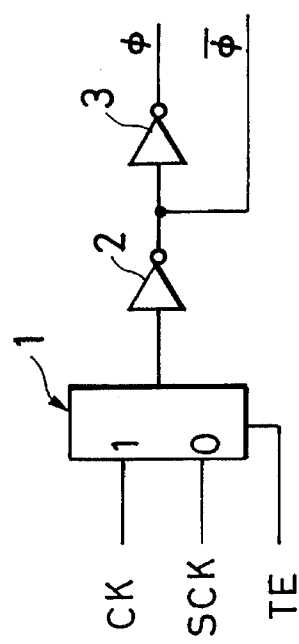
FIGS. 14a, 14b and 14c are circuit diagrams showing one example of a reset scanning latch circuit.
Figure 14B:
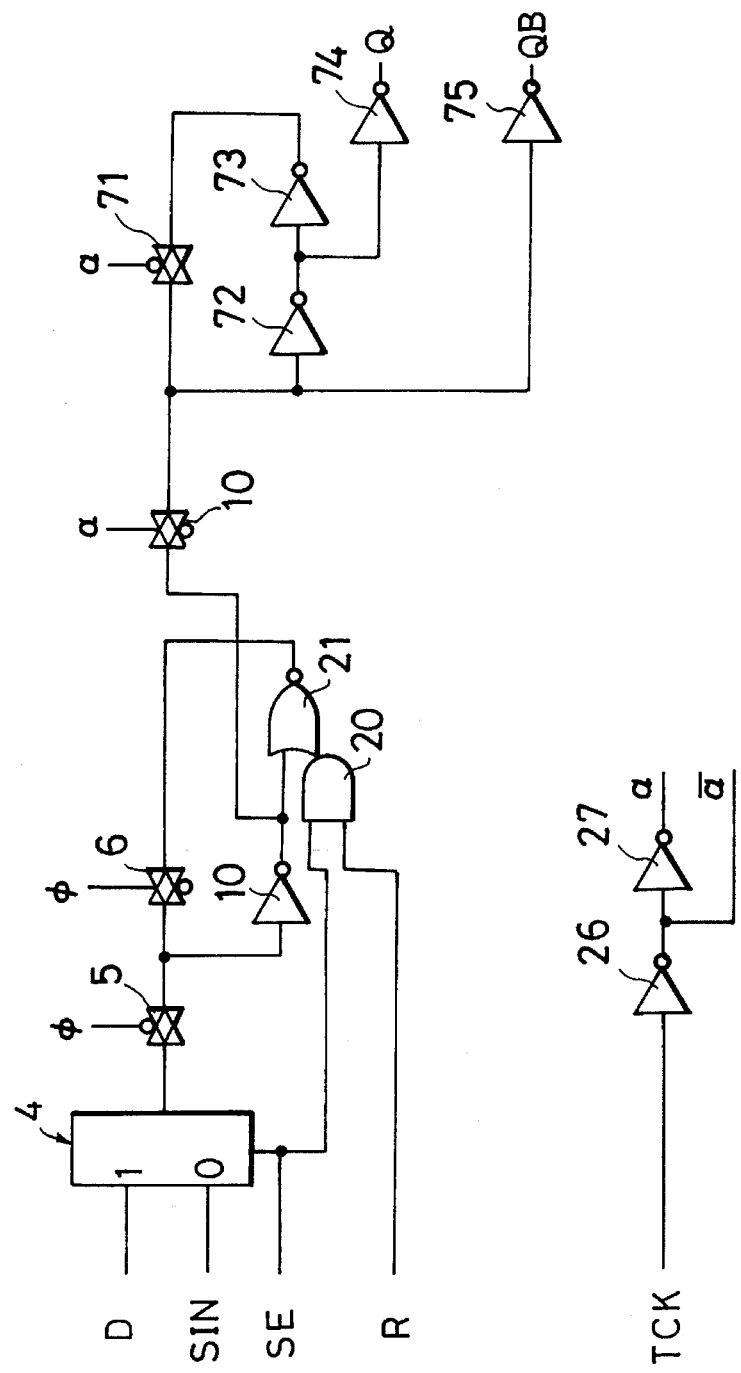
Figure 14C:
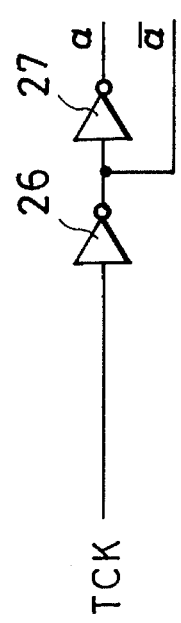

A latch circuit for scan in this embodiment is shown in FIGS. 14a, 14b and 14c. This latch circuit can be also constructed by a latch circuit asynchronously set and reset. A latch circuit on the master side has the same construction as the reset scanning register shown in FIGS. 13a, 13b and 13c. Namely, when the voltage level of a scanning enable signal (SE) is a level showing value "0", a resetting signal (R) of the latch circuit on the master side is invalidated. When the voltage level of the scanning enable signal (SE) is a level showing 1, the latch circuit on the master side is asynchronously reset when a voltage level of the resetting signal (R) is changed to a level showing value "1". Further, when the voltage level of the scanning enable signal (SE) is the level showing 1, the latch circuit on the master side inputs or holds normal data input (D) by a clock signal (φ) on the master side when the voltage level of the resetting signal (R) is a level showing value "0". A latch circuit on the slave side is constructed by a simple D-latch. As shown in FIG. 14c, this latch circuit on the slave side is operated by an internal clock signal α on the slave side formed from a clock signal for transferring data (TCK).

The operation of this scanning latch circuit will next be described. A voltage level of the clock signal (TCK) is fixed to a level showing value "1" at a normal operating time of the scanning latch circuit. Therefore, a voltage level of the internal clock signal α on the slave side is fixed to a level showing value "1". An operating mode of the latch circuit on the slave side is fixed to a transparent mode. In this transparent mode, the latch circuit on the slave side functions only as a buffer of the latch circuit on the master side. Accordingly, the latch circuit on the master side is operated at the normal operating time of the scanning latch circuit. When test data are scanned as shown in FIG. 10, the voltage levels of a scanning clock signal (SCK) and a clock signal for transferring data (TCK) first show value "0" and scanning data (SIN) are supplied to the latch circuit on the master side. At this time, the voltage level of the scanning clock signal (SCK) is changed to a level showing value "1" at a time B shown by this signal SCK in FIG. 10 and the scanning data are held by the latch circuit on the master side. Thereafter, the voltage level of the clock signal (TCK) is changed to a level showing 1 at a time C shown by this signal TCK in FIG. 10. Thus, the scanning data held on the master side are inputted to the latch circuit on the slave side. The voltage level of the clock signal (TCK) is then changed to the level showing value "0" at a time D shown by this signal TCK in FIG. 10. Thus, the test data are held by the latch circuit on the slave side. Then, the voltage level of the scanning clock signal (SCK) is changed to the level showing value "0" at a time E shown by this signal SCK in FIG. 10 so as to input the next scanning data to the latch circuit on the master side. Thereafter, the above-mentioned operations are repeatedly performed to input all the test data to each of the scanning registers and the scanning latch circuit.

Thus, when the voltage level of the clock signal (TCK) is changed to a level showing value "1" at a time S shown by signals α and β in FIG. 11, all the test data are inputted to each scanning latch circuit on the slave side and a testing operation of the scanning latch circuit is then started. The voltage level of the clock signal (TCK) is changed to a level showing value "0" at a time A shown by the signals α and β in FIG. 11 to hold the test data by the scanning latch circuit on the slave side until the testing operation is completed. Thereafter, the voltage level of a scanning enable signal (SE) is changed to a level showing value "1" at a time B shown by this signal SE in FIG. 11. The test results are then inputted to the latch circuit on the master side from the normal data input portion (D). Otherwise, a setting or resetting value provided by the test results is validated. Then, the voltage level of a scanning clock signal (SCK) is changed to a level showing value "0" at a time C shown by signal φ in FIG. 11 and the test results are inputted to the latch circuit on the master side. The clock signal of an asynchronous circuit is validated by changing the voltage level of a testing enable signal (TE) to a level showing value "1" at a time D shown by this signal TE in FIG. 11. Thus, all the test results are inputted to the latch circuit on the master side. Thereafter, the voltage level of the scanning clock signal (SCK) is changed to a level showing value "1" at a time E shown by this signal SCK in FIG. 11. Further, the voltage level of the testing enable signal (TE) is changed to a level showing value "0" at a time F shown by this signal TE in FIG. 11. Thus, the clock signal of the asynchronous circuit is invalidated by the latch circuit on the master side and the test results are held by this latch circuit on the master side. Then, the voltage level of the scanning enable signal (SE) is changed to a level showing value "0" at a time G shown by this signal SE in FIG. 11 and the setting or resetting operation with respect to the test results is invalidated. Thereafter, the voltage level of the clock signal (TCK) is changed to the level showing value "1" at a time H shown by this signal TCK in FIG. 11 and the test results are inputted to the latch circuit on the slave side. Then, the voltage level of the clock signal. (TCK) is changed to the level showing value "0" at a time I shown by this signal TCK in FIG. 11 and the test results are held by the latch circuit on the slave side. The test results obtained above are read out of an external output terminal while the data of these test results are scanned at a timing shown in FIG. 10, thereby judging whether a chip is defective or not. The next test data are simultaneously inputted to the latch circuit on the slave side.

As mentioned above, the clock signal of the latch circuit on the slave side is formed by only a clock signal for transferring data to form a latch cell for scan. Accordingly, a latch circuit asynchronously set or reset can be tested by the scanning method at the same timing as the scanning register with respect to the latch cell.

As mentioned above, in accordance with the present invention, a clock signal for transferring data and shifting scanning data is transmitted to a latch section at a time uninfluenced by the clock skew of an internal clock signal. Accordingly, there is no error in shift of the scanning data caused by the clock skew in any circuit arrangement of the scanning register.

Validation and invalidation of the setting or resetting operation of the latch circuit on the master side can be switched by the scanning enable signal. Validation and invalidation of the setting or resetting operation of the latch circuit on the slave side can be switched by the testing enable signal. The setting or resetting operation of both the latch circuits on the master and slave sides is invalidated at the scanning time. The setting or resetting operation of the latch circuit on the master side is validated only at the testing time. Thus, it is possible to test a setting or resetting signal by the scanning method.

The clock signal of the latch circuit on the slave side is formed by only a clock signal for transferring data to form a latch cell for scan. Accordingly, a latch circuit asynchronously set or reset can be tested by the scanning method at the same timing as the scanning register with respect to the latch cell.

Figure 16:
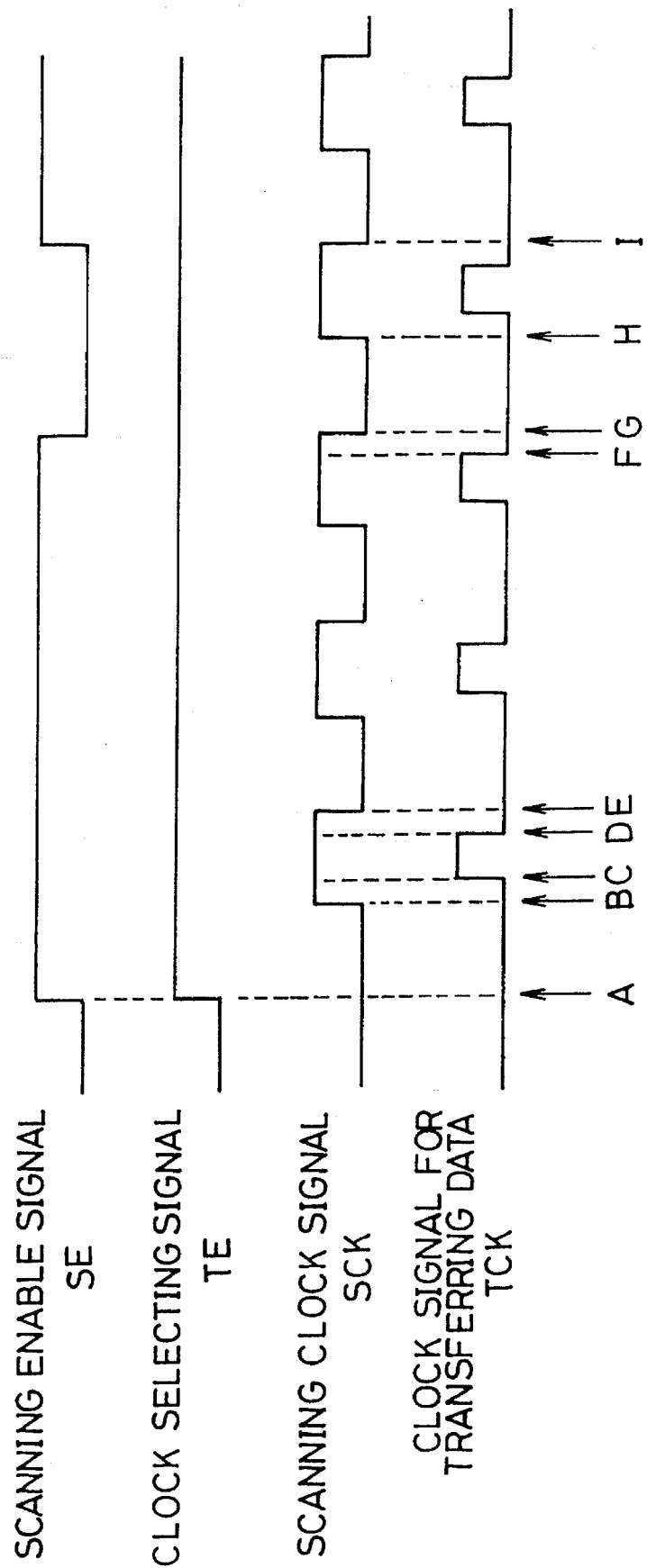
FIG. 16 is a timing chart showing an operation of the scanning circuit apparatus for test shown in FIGS. 15a and 15b.

FIGS. 15a and 15b are circuit diagrams of a scanning circuit apparatus for test in another embodiment of the present invention. These circuit diagrams in FIGS. 15a and 15b respectively correspond to those shown in FIGS. 7a and 7b. FIG. 16 is a timing chart showing an operation of the scanning circuit apparatus for test shown in FIGS. 15a and 15b.

In this another embodiment of the present invention, the scanning circuit apparatus has electric circuits having a multiplexer 1, inverters 2, 3, and inverters 17, 18 shown FIG. 7c. Namely, the scanning circuit apparatus in this embodiment has the same circuit structure as that shown in FIG. 7c.

The operation the scanning circuit apparatus in this embodiment shown in FIGS. 15a and 15b will next be described.

Normal data are input data at the time of a normal operation of the scanning circuit apparatus. Scanning data are input data at the time of a testing operation of the scanning circuit apparatus. The normal data and the scanning data are supplied to a multiplexer 4. The multiplexer 4 selects one of the normal data and the scanning data by transmitting a scanning enable signal for switching the normal operation and the testing operation of the scanning circuit apparatus to this multiplexer 4. The multiplexer 4 then outputs the selected data to a transmission gate 5. For example, when a voltage level of the scanning enable signal is a level showing value "0", the multiplexer 4 selects and outputs the normal data. In contrast to this, when the voltage level of the scanning enable signal is a level showing value "1", the multiplexer 4 selects and outputs the scanning data.

Similar to the scanning circuit apparatus for text shown in FIG. 7b, an output side of the multiplexer 4 shown in FIG. 15b is connected to transmission gates 5, 6 and a latch circuit constructed by inverters 10, 11. An output side of the inverter 10 is connected to a transmission gate 7.

An output side of the transmission gate 7 is connected to a transmission gate 8. The transmission gate 8 becomes active at a high voltage level. The transmission gate 8 is turned on when the voltage level of a clock signal for transferring data described in detail later shows value "1". The transmission gate 8 is turned off when the voltage level of this clock signal for transferring data shows value "0". Similar to the scanning circuit apparatus shown in FIG. 7b, an output side of the transmission gate 8 is connected to inverters 13 and 16 and a transmission gate 9. The output side of the transmission gate 8 is also connected to a transmission gate 12. The transmission gate 12 becomes active at a low voltage level. The transmission gate 12 is turned on when the voltage level of the above clock signal for transferring data shows value "0". The transmission gate 12 is turned off when the voltage level of the above clock signal for transferring data shows value Similar to the scanning circuit apparatus shown in FIG. 7b, an output side of the transmission gate 9 is connected to an inverter 14 and an output side of the transmission gate 12.

At the testing time, the clock signal for transferring data is transmitted to an inverter 17 from a clock generator for test disposed outside a large scale integrated circuit (LSI). In this scanning circuit apparatus, as shown in FIG. 7c, the inverter 17 is connected to an inverted clock signal output portion for transferring data. Further, an output side of the inverter 17 is connected to a clock signal output portion for transferring data through an inverter 18. The clock signal for transferring data is shown by mark a in FIGS. 15a, 15b and 7c. The clock signal for transferring data is transmitted to an enable terminal of the above transmission gate 8 and a disable terminal of the transmission gate 12. The inverted clock signal for transferring data is shown by mark $\overline{\alpha}$ in FIGS. 15a, 15b and 7c. The inverted clock signal for transferring data is transmitted to a disable terminal of the above transmission gate 8 and an enable terminal of the transmission gate 12.

One scanning register is constructed by the above-mentioned circuit elements. A scanning data output terminal 32 is connected to the scanning data input portion of a multiplexer 4' of a scanning register at the next stage, thereby constituting scanning registers at a plurality of stages. The scanning circuit apparatus for test is formed by these scanning registers.

The operation of the scanning circuit apparatus for test constructed above will next be described.

The scanning circuit apparatus shifts normal data in synchronization with a normal clock signal when a clock selecting signal having a voltage level indicative of value "0" is inputted to the multiplexer 1 and a scanning enable signal having a voltage level indicative of value "0" is inputted to the multiplexer 4.

As shown by signals SE and TE in FIG. 16, a clock selecting signal having a voltage level indicative of value "1" at a time A is transmitted to the multiplexer 1 to perform the testing operation of the scanning circuit apparatus. A scanning enable signal having a voltage level indicative of value "1" at the same time A is transmitted to the multiplexer 4. Accordingly, the multiplexer 1 selects the scanning clock signal and the multiplexer 4 selects the scanning data. The selected scanning clock signal and the selected scanning data are set to show value "0". In this state, the transmission gate 5 is turned on since the scanning clock signal shows value "0". Accordingly, the scanning data indicative of value "0" transmitted from the multiplexer 4 are supplied to the inverter 10 through the transmission gate 5. The inverter 10 inverts the supplied scanning data indicative of value "0" to scanning data indicative of value "1". These scanning data indicative of value "1" are transmitted from the inverter 10 to the transmission gate 7. At the present time, the voltage level of the scanning clock signal shows value "0" so that the transmission gate 7 is turned off.

The voltage level of the scanning clock signal is changed to a level showing value "1" at a time B as shown by SCANNING CLOCK SIGNAL SCK in FIG. 16. At this time, the transmission gates 5 and 9 are turned off and the transmission gates 6 and 7 are turned on. However, the transmission gate 8 connected to the output side of the transmission gate 7 is still turned off so that the inverter 10 is still electrically disconnected from the inverter 13 on the slave side.

The voltage level of a clock signal for transferring data is changed to a level showing value "1" by the above clock generator for test at a time C shown by CLOCK SIGNAL FOR TRANSFERRING DATA TCK in FIG. 16 at which a sufficient time has passed in consideration of the above clock skew of the scanning clock signal. Thus, at the time C, the transmission gate 8 is turned on and the transmission gate 12 is turned off. Accordingly, the scanning data indicative of value "1" transmitted from the inverter 10 are supplied to the inverters 13 and 16. The voltage level of a signal of these scanning data indicative of value "1" is inverted by these inverters 13 and 16. Thus, the scanning data indicative of value "0" are transmitted to the data output terminal 31 and the scanning data output terminal 32 and are then outputted therefrom. The voltage level of an output signal of the inverter 13 is inverted through the inverter 15. Thus, the scanning data indicative of value "1" are outputted from the inverted data output terminal 30. The voltage level of the scanning clock signal is changed to a level showing value "1" at the above time B. Accordingly, the transmission gate 5 on the master side is turned off at this time B. Therefore, the scanning data outputted from the multiplexer 4 are transmitted onto the slave side, thereby causing no problem that a test vector as the stored scanning data is destroyed.

The voltage level of the clock signal for transferring data is changed to a level showing value "0" at a time D shown by CLOCK SIGNAL FOR TRANSFERRING DATA TCK in FIG. 16. Accordingly, the transmission gate 8 is turned off and the transmission gate 12 is turned on. The scanning data are latched to the latch circuit on the slave side and are held therein. As shown by SCANNING CLOCK SIGNAL SCK in FIG. 16, after the time D, the voltage level of the scanning clock signal is changed to the level showing value "0" at a time E. Accordingly, the transmission gate 5 is turned on and the transmission gates 6 and 7 are turned off. Thus, the next scanning data are supplied to the latch circuit on the master side.

The above-mentioned operations are repeatedly performed so that the scanning data are supplied and set to all the scanning registers while these scanning data are scanned.

It is assumed that the scanning data are held on the slave side of all the scanning registers by a fall of the clock signal for transferring data at a time F shown in FIG. 16. As shown by SCANNING CLOCK SIGNAL SCK and SCANNING ENABLE SIGNAL SE in FIG. 16, the voltage level of the scanning clock signal is changed to the level showing value "0" and the voltage level of the scanning enable signal is also simultaneously changed to a level showing value "0" at a time G. Accordingly, the multiplexer 4 selects the normal data supplied thereto and transmits the selected normal data. The results of a tested circuit are supplied onto the master side by the scanning data set on the slave side of the scanning registers. Thus, data of the supplied test results are latched to the latch circuit on the master side in accordance with the above-mentioned operations by changing the voltage level of the scanning clock signal to the level showing value "1" again at a time H shown by SCANNING CLOCK SIGNAL SCK in FIG. 16. Thereafter, the voltage level of the scanning enable signal is changed to the level showing value "1" at a time I shown by this signal SE in FIG. 16, thereby performing an inputting operation with respect to the scanning data. The latched data of the test results are transmitted to the exterior of the scanning circuit apparatus by shifting these latched data and are compared with data of a true pattern to judge whether the large scale integrated circuit is defective or not.

As mentioned above, no scanning data are shifted by only the scanning clock signal at the time of the testing operation as in the general scanning circuit apparatus. A clock signal for transferring data and shifting the scanning data is transmitted to a scanning register at a time uninfluenced by clock skew of the scanning clock signal. Accordingly, there is no error in shift of the scanning data caused by the clock skew in any circuit arrangement of the scanning register.

As mentioned above, in accordance with this embodiment, a clock signal for transferring data and shifting the scanning data is transmitted to a latch section at a time uninfluenced by the clock skew of an internal clock signal. Accordingly, there is no error in shift of the scanning data caused by the clock skew in any circuit arrangement of the scanning register.

Many widely different embodiments of the present invention may be constructed without departing from the spirit and scope of the present invention. It should be understood that the present invention is not limited to the specific embodiments described in the specification, except as defined in the appended claims.

What is claimed is:

1. A flip-flop circuit for eliminating clock skewing between scan registers when testing integrated circuits comprising:

an internal clock signal generating section for generating and transmitting an internal clock signal;

a data transferring clock signal generating section for generating and transmitting a data clock signal; and a latch section connected to the internal clock signal generating section and the data transferring clock signal generating section, the latch section having first and second portions and configured to latch received scanning data in the first portion in response to the internal clock signal at the time of a testing operation and to transfer the latched scanning data in the first portion to the second portion in response to a sequencing of the data clock signal and the internal clock signal, said sequencing of the data clock signal and the internal clock signal being configured so that the latched scanning data is transferred from the first portion to the second portion after a predetermined time has passed since the scanning data was latched in the first portion.

2. A flip-flop circuit according to claim 1, wherein the predetermined time is set such that scanning data transferred to the second portion of said latch section is not influenced by clock skewing of the internal clock signal.

3. A flip-flop circuit according to claim 1, wherein the internal clock signal generating section, the data transferring clock signal generating section and the latch section prevent latched scanning data transmitted from the first portion of the latch section from being changed before the latched scanning data are latched to the second portion of the latch section even when clock skewing occurs in the internal clock signal.

4. A scanning method of testing a device, comprising the steps of:

generating and transmitting an internal clock signal in a first clock signal generating section;

generating and transmitting a second clock signal in a second clock signal generating section;

latching scanning data in a first portion of a latch circuit in response to the internal clock signal at the time of a testing operation; and transmitting the latched scanning data to a second portion of the latch circuit in response to a sequencing of the second clock signal and the internal clock signal, said sequencing of the internal clock signal and the second clock signal being configured so that the latched scanning data is transferred from the first portion to the second portion after a predetermined time has passed since the scanning data were latched in the first portion.

5. A scanning method according to claim 4, wherein the predetermined time is set such that scanning data transmitted to the second portion of said latch circuit is not influenced by clock skewing of the internal clock signal.

6. A scanning method according to claim 4, in which the latched scanning data transmitted from the first portion of the latch circuit is prevented from being changed before the latched scanning data is latched to the second portion of the latch circuit even when clock skewing occurs in the internal clock signal.

7. A flip-flop circuit comprising:

an internal clock signal generating section for generating an internal clock signal and for transmitting the generated internal clock signal;

a data transferring clock signal generating section for generating a second clock signal and transmitting the second clock signal; and a latch section having a first stage connected to the internal clock signal generating section, the first stage of the latch section is configured to latch received scanning data in response to the internal clock signal transmitted at the time of a testing operation, and is configured to output the latched scanning data to a second stage of the latch section, the second stage is connected to the internal clock signal generating section and the data transferring clock generating section and is responsive to the internal clock signal to receive the latched scanning data and responsive to the second clock signal to latch the received latched scanning data in the second stage after a predetermined time has passed since the scanning data were latched in the first stage.

8. A flip-flop circuit according to claim 7, wherein the predetermined time is set such that latched scanning data transferred to the second stage is uninfluenced by clock skewing of the internal clock signal.

9. A flip-flop circuit according to claim 7, wherein the internal clock signal generating section, the data transferring clock signal generating section and the latch section prevent the latched scanning data transmitted from the first stage of the latch section from being changed before the latched scanning data are latched into the second stage of the latch section even when clock skewing occurs in the internal clock signal.

* * * * *